(12) United States Patent
Koda et al.

(10) Patent No.: US 6,326,796 B1
(45) Date of Patent: *Dec. 4, 2001

(54) HARMONIC MEASURING METHOD AND A CURRENT INJECTION DEVICE FOR HARMONIC MEASUREMENT

(75) Inventors: Isao Koda; Masakazu Tsukamoto, both of Aichi; Shoji Nishimura, Kyoto; Katsuhiko Uno, Kyoto; Yasuyuki Natsuda, Kyoto; Yoshifumi Minowa, Kyoto, all of (JP)

(73) Assignees: Nissin Electric Co., Ltd., Kyoto; Chubu Electric Power Co., Inc., Nagoya, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/110,997

(22) Filed: Jul. 6, 1998

(30) Foreign Application Priority Data

| Jul. 7, 1997 | (JP) | 9-197806 |
| Jul. 7, 1997 | (JP) | 9-197807 |
| Jul. 7, 1997 | (JP) | 9-197808 |
| Jul. 7, 1997 | (JP) | 9-197809 |
| Jul. 7, 1997 | (JP) | 9-197810 |

(51) Int. Cl.$^7$ .................................................. G01R 23/16
(52) U.S. Cl. .................. 324/707; 324/76.12; 324/76.21; 324/623
(58) Field of Search ...................... 324/707, 76.12, 324/76.24, 76.15, 76.32, 76.58, 623, 76.21

(56) References Cited

U.S. PATENT DOCUMENTS

| 4,667,152 | * | 5/1987 | Hayes et al. | 324/76.12 |
| 5,465,203 | * | 11/1995 | Bhattacharya et al. | 363/40 |
| 5,465,287 | * | 11/1995 | Egozi | 379/5 |
| 5,499,178 | * | 3/1996 | Mohan | 363/39 |
| 5,642,007 | * | 6/1997 | Gyugyi et al. | 307/102 |
| 5,814,901 | * | 9/1998 | Ihara | 307/105 |
| 5,847,944 | * | 12/1998 | Jang et al. | 363/44 |
| 5,933,793 | * | 8/1999 | Yamada | 702/65 |
| 6,075,350 | * | 6/2000 | Peng | 323/207 |
| 6,114,859 | * | 9/2000 | Koda et al. | 324/619 |
| 6,208,945 | | 3/2001 | Koda et al. . | |

OTHER PUBLICATIONS

Institute of Electrical Engineers of Japan, vol. 101–8B, pp. 451–458 (Showa 56–8).

* cited by examiner

*Primary Examiner*—Safet Metjahic
*Assistant Examiner*—T. R. Sundaram
(74) *Attorney, Agent, or Firm*—Finnegan, Henderson, Farabow, Garrett & Dunner, L.L.P.

(57) ABSTRACT

A harmonic injection point a is set on a power line extending downstream from a harmonic measuring point b in an electric power system. The currents of interharmonics are injected to the harmonic injection point a by a current injection device. The frequencies of the interharmonics are located on both sides of the frequency of an n-th targeted harmonic in frequency spectrum and each of the frequencies is a nonintegral multiple of the frequency of a fundamental wave of an electric power transmitted by the electric power system. The current values and voltage values of the interharmonics at the harmonic measuring point are detected to thereby obtain admittance values of an equivalent circuit of a power line extending upstream from the harmonic measuring point b when the interharmonics flow therethrough. An admittance value of the equivalent circuit of the power line when the targeted harmonic flows therethrough is determined by interpolating the admittance values for the interharmonics. Measurement is made of a harmonic characteristic of the power line extending upstream from the harmonic measuring point b, which is set at a point located upstream from the harmonic injection point a.

6 Claims, 8 Drawing Sheets

HARMONIC MEASURING METHOD AND A CURRENT INJECTION DEVICE FOR HARMONIC MEASUREMENT

BACKGROUND OF THE INVENTION

1. Field of the Invention

The present invention relates to a harmonic measuring method in use with an electric power system, and a current injection device used for the harmonic measuring method.

2. Description of the Related Art

In an electric power system, it is very important to reduce the higher harmonics of an electric power.

The frequencies of the higher harmonics are each an integral multiple of the frequency $f_s$ of a fundamental wave of the electric power. The frequency of the fifth harmonics typically used, is $5 \times f_s$.

In an ordinary method for reducing the harmonic components in the electric power, the voltage levels of the harmonics are estimated and a filter for suppressing the harmonics is connected to the power line in the electric power system.

To estimate the harmonic voltage levels, a node where a filter is connected to the power line is used as a harmonic measuring point. The harmonic characteristics at points upstream and downstream from the harmonic measuring point are obtained, and the equivalent circuit is depicted on the basis of the harmonic characteristics.

The equivalent circuit may be depicted as a parallel circuit of an admittance and a current source as taught by Norton's theorem.

In connection with this, a unique approach is described in the Institute of Electrical Engineers of Japan, Vol. 101-8B, pp. 451–458 (Showa 56-8). To set up an equivalent circuit of the distribution line for the 5th harmonic, the approach measures the voltage and current of the fundamental wave of the electric power transmitted in the electric power system, and the values of the admittance and the current source, its phase and other factors of the equivalent circuit are estimated by a mathematical process.

In the harmonic measuring method described in the above paper, to obtain the equivalent circuit for the n-th harmonic (whose frequency is $n \times f_s$) of the electric power transmitted in the electric power system, the values of the admittance and the current source, and the phases of the equivalent circuit are determined through the estimation thereof based on the voltage and current of the electric power, which are measured. Therefore, the obtained circuit constants of the equivalent circuit are not exact.

In the conventional harmonic measuring method, to obtain the values of the admittance and current source of the equivalent circuit for the targeted harmonic as an object to be measured, the fundamental wave is measured, and a level (vector value) of the targeted harmonic is estimated on the level (vector value) of the fundamental wave. In other words, the circuit constants of the equivalent circuit is obtained not through a direct measurement of them. Therefore, the obtained equivalent circuit is unsatisfactory in its accuracy.

Thus, the harmonic characteristic in the electric power system that is obtained by the conventional harmonic measuring method is unsatisfactory in its accuracy. This makes it impossible to select a proper filter for suppressing or removing the harmonic components in or from the electric power system, and hence to effectively suppress or remove the harmonic components.

An inventive and unique technique to obtain the harmonic equivalent circuit was disclosed in Japanese Patent Application No. Hei-8-310192, filed by the applicant of the present application. In our technique, the harmonics of different frequencies are used. The frequency of a targeted harmonic is the intermediate between the frequencies of the interharmonics. The frequencies of the interharmonics are each a nonintegral multiple of the frequency of the fundamental wave of the electric power in the electric power system. The currents of the interharmonics are injected into a harmonic injection point on the power line in the electric power system. The voltage values of the interharmonics are measured at the harmonic injection point, and the current values of the interharmonics flowing through the power lines upstream and downstream from the harmonic injection point are measured. The admittance values of equivalent circuits of the power lines, located upstream and downstream from the harmonic injection point, for the interharmonics of the frequencies, are determined by use of the actual measurement results on the injected interharmonics, and those equivalent circuits are specified by the obtained admittance values.

It is noted that the interharmonics to be injected are not present originally in the electric power system, and that the admittance values of the equivalent circuits for the injected interharmonics are obtained through an actual measurement. Therefore, the obtained harmonic characteristic for the targeted harmonic is reliable.

In our harmonic measuring method, the harmonic injection point and the harmonic measuring point are set at the same point. To measure the harmonic characteristic of an upstream power line including an upstream bus, it is necessary to set the harmonic injection point on the upstream bus of high voltage.

Therefore, the harmonic injection point is at high voltage, and the current injection device is coupled with the high voltage injection point. Such a device must have a high voltage rank (insulation rank) and be satisfactorily protected against the high voltage.

The current injection device having the high voltage rank and being highly protected against high voltage becomes necessarily large in size, complicated in construction, and high in cost to manufacture. Therefore, it is impossible to simplify the device construction, to decrease the device cost, and to accurately measure the harmonic characteristic of the upstream bus.

A possible measure to cope with this is to locate the harmonic injection point at a point downstream from the harmonic injection point. In this case, one or more number of substation transformers must be located between the harmonic measuring point and the harmonic injection point. Further, the currents of the interharmonics to be injected to the harmonic injection point must be large in order to secure a reliable measurement at the harmonic measuring point. This necessitates the use of the harmonic current injecting device of an extremely large current capacity. In this case, large current injected is concentrated at one point to cause the problem of a called harmonic interference.

In our harmonic measuring method, the harmonic injection point and the harmonic measuring point are set at the same point. Accordingly, the harmonic measuring method measures the harmonic characteristic of only the whole upstream or downstream power line. In other words, the harmonic measuring method cannot individually measure the harmonic characteristics of a plural number of power lines branched downstream from the harmonic injection point.

Further, our measuring method requires the current injection device for injecting the currents of the interharmonics of the frequencies f1 and f2, which are located on both sides of the frequency of the targeted harmonic in frequency spectrum.

In case where the electric power system is of the distribution-line carrier communication type, a master station located upstream of the electric power system sends switch control information to slave stations attached to segment switches via distribution lines.

Where the harmonic characteristics of the distribution system, which is of the distribution-line carrier communication type and has the switch control function, are measured by our harmonic measuring method, if the master station and the slave stations are equipped with the current injection devices and the like, an installation cost is increased.

In this case, it is necessary to select the frequencies f1 and f2 of the injected interharmonics to be different from the communication frequency for the switch control so as to avoid the interference of the current injection for the harmonic measurement with the switch control.

Since our harmonic measuring method requires the harmonic injection device, the measuring device is inevitably increased in size. Therefore, the technical subject presented to us is how to form and inject the currents of the interharmonics with the small current injection device,

SUMMARY OF THE INVENTION

Accordingly, it is an object of the present invention to provide a harmonic measuring method which measures a harmonic characteristic of an upstream power line in an electric power system by injecting the currents of interharmonics of which the frequencies are located on both sides of the frequency of the targeted harmonic in frequency spectrum.

It is another object of the invention to provide a current injection device used for the harmonic measuring method which is low in the voltage rank, small in size and simple in construction.

It is another object of the invention to provide a harmonic measuring method which measures a harmonic characteristic of a power line extending upstream from a harmonic measuring point by injecting the currents of the interharmonics of which the frequencies are located on both sides of the frequency of a targeted harmonic into a power line extending downstream from the harmonic measuring point.

It is another object of the invention to provide a current injection device used for the harmonic measuring method which is low in voltage rank and relatively small in current capacity.

It is another object of the invention to provide a harmonic measuring method which can measure individually harmonic characteristics of the branched power lines extending upstream or downstream from harmonic injection points.

It is another object of the invention to provide a harmonic measuring method which can measure harmonic characteristic of a distribution line system, which is of the distribution-line carrier communication type and has a switch control function, without the current injection device exclusively used for injecting the currents of the interharmonics.

It is another object of the invention is to provide a current injection device used for the harmonic measuring method which is small in current capacity and size, with reduction of the time of injecting the currents of the interharmonics.

To solve the above problems, there is provided a harmonic measuring method comprising the steps of:

setting a harmonic injection point on a power line extending downstream from a harmonic measuring point in an electric power system;

injecting the currents of interharmonics to the harmonic injection point by a current injection device coupled to the harmonic injection point, the frequencies f1 and f2 of the interharmonics being located on both sides of the frequency of an n-th targeted harmonic in frequency spectrum and each of the frequencies being a nonintegral multiple of the frequency $f_s$ of a fundamental wave of an electric power transmitted by the electric power system, the frequency of the n-th targeted harmonic being $n \times f_s$, and $f1 < n \times f_s < f2$;

detecting the current values and voltage values of the interharmonics at the harmonic measuring point to thereby obtain admittance values of an equivalent circuit of a power line extending upstream from the harmonic measuring point when the interharmonics flow therethrough;

determining an admittance value of the equivalent circuit of the power line when the targeted harmonic flows therethrough by interpolating the admittance values for the interharmonics; and measuring a harmonic characteristic of the power line extending upstream from the harmonic measuring point, which is set at a point located upstream from the harmonic injection point.

Therefore, the harmonic injection point is set at a position downstream from the harmonic measuring point on the power line in the electric power system. Therefore, the voltage rank of the current injection device for injecting the currents of the interharmonica having the frequencies f1 and f2 to the harmonic injection point may be lowered than that of the current injection device used in the harmonic measuring method where the harmonic injection point and the harmonic measuring point are set at the same position on the power line. Accordingly, the protecting circuit for protecting the current injection device against high voltage voltage may also be simplified.

For this reason, the current injection device 16 may be reduced in size and simplified in construction.

In the high frequency measuring method of the present invention, the interharmonics of the frequencies of which the currents are to be injected to the harmonic injection point, are not present originally in the power line in the electric power system. To measure a harmonic characteristic in the electric power system, the currents of those interharmonics are injected to the harmonic injection point from the current injection device; the currents and voltages of the injected interharmonics are measured at the harmonic measuring point; the admittances of the equivalent circuit of the power line extending upstream from the harmonic measuring point when the interharmonics flow therethrough are obtained; the admittance of the equivalent circuit for the targeted harmonic is determined by use of the obtained admittances of the interharmonics; and the harmonic characteristic of the upstream power line for the targeted harmonic is measured. Therefore, the harmonics measuring method of the invention can measure a harmonic characteristic of the power line for a targeted harmonic, which is located upstream from the harmonic measuring point set at a position upstream from the harmonic injection point, with small size and simple construction of the related device.

According to another aspect of the invention, there is provided a harmonic measuring method comprising the steps of;

setting a plural number of harmonic injection points on a plural number of low voltage buses branched downstream from a harmonic measuring point in an electric power system;

connecting current injection devices to the plural number of harmonic injection points;

injecting, simultaneously and synchronously, the currents of interharmonics to the harmonic injection point by the current injection devices, the frequencies f1 and f2 of the interharmonics being located on both sides of the frequency of an n-th targeted harmonic in frequency spectrum and each of the frequencies being a nonintegral multiple of the frequency $f_s$ of a fundamental wave of an electric power transmitted by the electric power system, the frequency of the n-th targeted harmonic being $n \times f_s$, and $f1 < n \times f_s < f2$;

detecting the current values and voltage values of the interharmonics at the harmonic measuring point by a characteristic measuring device coupled to the harmonic measuring point, to thereby obtain admittance values of an equivalent circuit of a power line extending upstream from the harmonic measuring point when the interharmonics flow therethrough;

determining an admittance value of the equivalent circuit of the power line when the targeted harmonic flows therethrough by interpolating the admittance values for the interharmonics; and measuring a harmonic characteristic of the power line extending upstream from the harmonic measuring point.

Therefore, the harmonic injection points are set on the distribution buses branched downstream from the power line on which the harmonic measuring point is set. The currents of the interharmonics used for the measurement at the harmonic measuring point result from the currents of the interharmonics injected at the different harmonic injection points.

The voltage rank of each of current injection devices located near the harmnonic injection points may be low. The current capacity of the current injection device is lower than when one harmonic injection point is used and one current injection device is used. Therefore, the current injection device of low voltage rank and small current capacity may be used for the harmonic measurement.

The current injection devices inject the currents sof the interharmonics to the harmonic injection points in a synchronous manner. The interharmonic currents thus injected are added together, and the resultant current, large in level, is fed to a point downstream from the harmonic measuring point. A harmonic characteristic measuring device accurately measures the current and voltage of the interharmonic at the harmonic measuring point, and obtains the value of the admittance of an equivalent circuit of the power line.

The interharmonics of the frequencies are not present originally in the electric power system. An exact measurement of the admittance of the equivalent circuit is secured even if the current and voltage levels of the interharmonics are low.

In the harmonic measuring method of the second embodiment, the admittance of the equivalent circuit located upstream from the harmonic measuring point, which is for the targeted harmonic, is determined on the basis of the admittance of the equivalent circuit for the interharmonics. Therefore, each current injection device, which is low in voltage rank and small in current capacity, and the measurement of the harmonic characteristic for the targeted harmonic is exact.

According to yet another object of the present inventions there is provided a harmonic measuring method comprising the steps of:

connecting a current injection device to a harmonic measuring point on an electric power system;

injecting the currents of interharmonics to the harmonic injection point by the current injection device in response to an output signal of a synchronizing device, which is synchronized with the fundamental wave of an electric power transmitted by the electric power system, the frequencies f1 and f2 of the interharmonics being located on both sides of the frequency of an n-th targeted harmonic in frequency spectrum and each of the frequencies being a nonintegral multiple of the frequency f, of the fundamental wave, the frequency of the n-th targeted harmonic being $n \times f_s$, and $f1 < n \times f_s < f2$;

setting a plural number of harmonic measuring points on a plural number of power lines branched downstream or upstream from the harmonic injection point in the electric power system;

setting harmonic measuring devices at the plural number of harmonic measuring points;

frequency analyzing the current and voltage measured at the harmonic measuring points by the harmonic measuring devices in synchronism with the output signal of the synchronizing device;

detecting the currents and voltages of the interharmonics at the harmonic measuring points through the frequency analyzing, to thereby determine admittance values of an equivalent circuit of the power line extending downstream or upstream from each the harmonic measuring point when the interharmonics flow therethrough;

determining an admittance value of the equivalent circuit of the power line when the targeted harmonic flows therethrough by interpolating the admittance values for the interharmonics, to thereby measure a harmonic characteristic for the targeted harmonic.

Therefore, the current injection device injects the currents of the interharmonics of the frequencies f1 and f2 into the harmonic injection point in synchronism with the sync signal output from the synchronizing signal generator, while receiving the sync signal therefrom. The interharmonics are not contained in the harmonics of an electric power in the electric power system. The frequencies f1 and f2 of the interharmonics are each a nonintegral multiple of the frequency $f_s$ of the fundamental wave of the electric power.

The harmonic measuring points are set on the branch power lines to be measured, which are located downstream from the harmonic injection point.

The voltage and current values measured at the harmonic measuring point are frequency analyzed by the harmonic measuring device, whereby the voltage and current of the interharmonics of the frequencies f1 and f2 at that point are detected. The admittance (value) and the current source (value) of each branch power line for the interharmonics are determined to thereby specify the equivalent circuit defined by the determined circuit constants.

The admittance of the equivalent circuit for the interharmonics of the frequencies f1 and f2 is mathematically processed for interpolation to determine an admittance (value) of the equivalent circuit for the targeted harmonic. Therefore, the harmonic characteristics at the harmonic measuring points located downstream from the harmonic injection point are accurately measured for the targeted harmonic in an individual manner.

For this reason, the harmonic characteristics of the branch power lines or the electric power consumers, located downstream from the harmonic measuring point, can individually be measured for the targeted harmonic in a high degree of accuracy. The same thing is true for a case where the harmonic measuring points are located upstream from the harmonic injection point.

According to a further aspect of the invention, there is provided a harmonic measuring method comprising the steps of:

injecting the currents of interharmonics to a harmonic injection point in an electric power system, the frequencies f1 and f2 of the interharmonics being located on both sides of the frequency of an n-th targeted harmonic in frequency spectrum and each of the frequencies being a nonintegral multiple of the frequency $f_s$ of the fundamental wave of an electric power transmitted by the electric power system, the frequency of the n-th targeted harmonic being $n \times f_s$, and $f1 < n \times f_s < f2$, determining admittance or impedance values of an equivalent circuit of the power line extending downstream or upstream from the harmonic measuring point when the interharmonics flow therethrough by frequency analyzing the currents and voltages of the electric power measured at the harmonic measuring point, and determining an admittance value or an impedance value of the equivalent circuit of the power line when the targeted harmonic flows therethrough by interpolating the admittance or impedance values for the interharmonics, to thereby measure a harmonic characteristic for the targeted harmonic;

wherein:

A) the electric power system includes a power distribution system in which switch control information is sent from a master station to a slave station by use of a distribution-line carrier communication system;

B) the master station includes a current injecting device for selectively injecting a communication signal for the distribution-line carrier communication or the currents of the interharmonics of the frequencies f1 and f2; and C) when a harmonic measurement is conducted, the master station injects the currents of the interharmonics to the harmonic injection points Therefore, when a harmonic characteristic of the power distribution system of the distribution-line carrier communication type is measured, the current injection device of a master station in a distribution-line carrier communication system changes its operation mode from a first injection mode for injecting a communication signal to a second mode for injecting the currents of interharmonics having frequencies f1 and f2.

Therefore, the master station may be used for both the carrier communication and a harmonic measurement. Further, a harmonic characteristic of a distribution line system may be measured without using a harmonic characteristic measuring device exclusively used for the harmonic measurement.

When the slave station is coupled to the harmonic measuring point, the slave station includes:

A) a reception processor for receiving a communication signal by a measuring current transformer and a measuring transformer, both coupled with the power distribution system, and reproducing the same;

B) a characteristic measuring device for determining admittance or impedance values of an equivalent circuit of the power line extending downstream or upstream from the harmonic measuring point when the interharmonics flow therethrough by frequency analyzing the measuring signals output from the measuring current transformer and the measuring transformer, and for determining an admittance value or an impedance value of the equivalent circuit of the power line when the targeted harmonic flows therethrough by interpolating the admittance or impedance values for the interharmonics; and C) when a harmonic measurement is conducted, the slave station at the harmonic measuring point detects the currents and voltages of the interharmonics injected into the power distribution system, to thereby measure the harmonic characteristic.

The slave stations coupled to the harmonic measuring points are used for both the distribution-line carrier communication and the harmonic measurement. At the time of harmonic measurement, a harmonic characteristic of the power line extending upstream or downstream from each harmonic measuring point is measured by the harmonic characteristic measuring device of the related slave station.

Therefore, the harmonic characteristic is measured by the utilization of not only the master station but also the slave stations.

According to an additional aspect of the invention, there is provided a current injection device for a harmonic measurement comprising:

an inverter of which the output frequency is successively varied to the frequencies of the interharmonics;

a filter portion for extracting only the interharmonics from the output signal of the inverter and outputting the extracted ones, the filter portion including a resonance circuit whose resonance point is set at the mid point between the frequencies of the interharmonics; and a coupling transformer for injecting the currents of the interharmonics received from the filter portion into the electric power system.

The frequency of the output signal of the inverter is successively varied to the frequencies of the interharmonics.

The following harmonic measurement has been disclosed. In the measurement, the currents of interharmonics are injected into a current injection point in an electric power system The frequencies of the interharmonics are located on both sides of the frequency of a higher harmonic (at which the harmonic characteristic of the electric power system is measured), or targeted harmonic, in frequency spectrum and each of the frequencies being a nonintegral multiple of the frequency $f_s$ of a fundamental wave of an electric power transmitted by the electric power system. Admittance values of an equivalent circuit of the power line when the interharmonics flows therethrough are determined by use of the measured current and voltage values of the interharmonics. An admittance value of the equivalent circuit for the targeted harmonic is determined by interpolating the admittance or impedance values for the targeted harmonic, whereby a harmonic characteristic of the power line for the targeted harmonic is measured.

The frequency of the output signal of the inverter is successively varied to the frequencies of the interharmonics.

The filter portion resonates with the frequencies of the interharmonics. Through the resonance, the filter portion filters off the frequencies are selected to remove unnecessary frequencies, e.g., the frequency of the fundamental wave of the electric power, and the frequencies being multiples of the frequencies of the interharmonics. In other words, the filter portion allows only the interharmonics to pass therethrough, by its frequency selective function.

The currents of the interharmonics may be injected from the filter portion through the coupling transformer to the power distribution system.

In this case, a single current injection device may be used for the current injection.

Further, the frequency of the output signal of the current injection device is successively varied to the frequencies of the interharmonics, and the current injection is completed for a short time.

PREFERRED EMBODIMENTS OF THE INVENTION

<First Embodiment>

A first embodiment of the present invention will be described with reference to FIG. 1.

Figure 1:
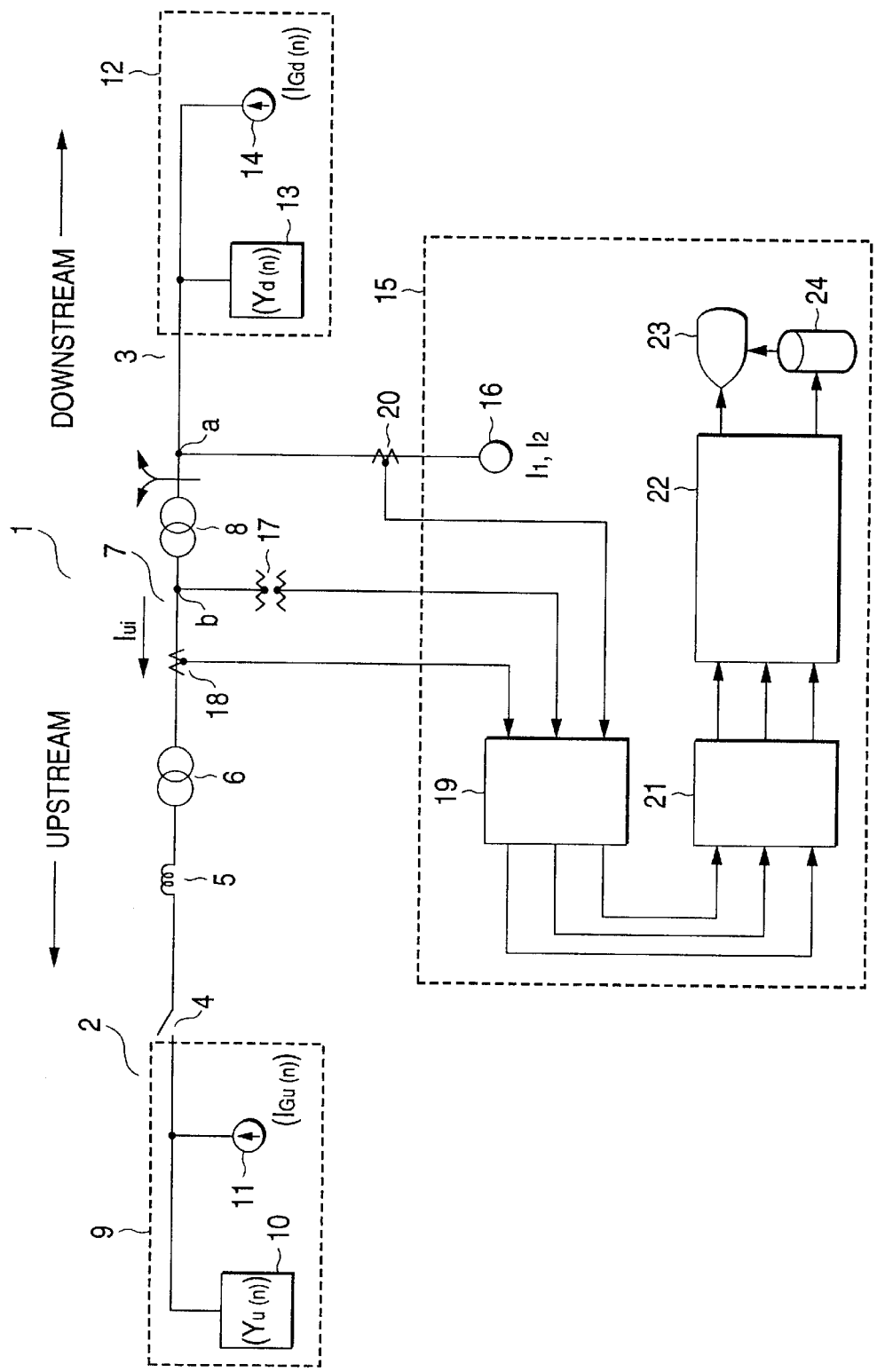
FIG. 1 is a circuit diagram showing a first embodiment of the present invention.

FIG. 1 is a single line system diagram showing how to measure a harmonic characteristic of a 77 kV high voltage bus 2 by a harmonic measuring method which is a first embodiment of the present invention. In the measurement, the currents of interharmonics of specific different frequencies are injected to a position on a 6.6 kV distribution bus 3, which is branched downstream from the 77 kV high voltage bus 2 in an electric power system 1.

The distribution bus 3 is connected to the high voltage bus 2, through a circuit breaker 4, an upstream line impedance 5, a substation (secondary substation) transformer 6, a second high voltage bus 7 at 22 kV and a distribution-substation transformer 8. A harmonic injection point a is set at a point near the secondary side of the distribution-substation transformer 8 of the distribution bus 3, and a harmonic measuring point b is set at a point near the primary side of the distribution-substation transformer 8.

Many higher harmonics having frequencies being each an integral multiple of the fundamental frequency $f_s$ of the power system, are present in an electric power system. An upstream equivalent circuit 9 of the high voltage bus 2 for an n-th harmonic (whose frequency is $n \times f_s$) as a targeted harmonic may be depicted as a parallel circuit consisting of an admittance 10 and a current source 11 as taught by Norton's theorem.

A downstream equivalent circuit 12 located downstream from the harmonic injection point a for the targeted harmonic may also be depicted as a parallel circuit of an admittance 13 and a current source 14 as taught by Norton's theorem.

A current injection device 16 of a harmonic measuring device 15 is connected to the harmonic injection point a. The current injection device 16 iteratively measures the harmonic characteristic of the high voltage bus 2. To this end, the currents of interharmonics of frequencies f1 and f2 ($f1 < n \times f_s < f2$), which are nonintegral multiples of the fundamental frequency $f_s$, are sequentially and iteratively injected into tho harmonic injection point a at fixed time intervals, e.g., 30 minutes.

For the measurement of the harmonic characteristic, the currents I1 and I2 of the interharmonics may be either synchronous or asynchronous with the system power source. Usually, a digital frequency analysis, e.g., DFT or FFT, is used for detecting the current and voltage of the injected harmonics to be given later. For this reason, it is preferable to generate the currents I1 and I2 in synchronism with the frequency of the electric power of the system power source.

To this end, a synchronizing unit (not shown) is provided in the harmonic measuring device 15, for examples The synchronizing unit generates a synchronizing (sync) control signal, which is synchronized with an electric power voltage of the fundamental frequency $f_s$ on the distribution bus 3. The frequency of the sync control signal is a multiple of the fundamental frequency $f_s$. The sync control signal is supplied to the current injection device 16. In response to the sync control signal, the current injection device 16 produces the currents I1 and I2 of the interharmonics of the frequencies f1 and f2 through a PLL sync oscillation.

The current injection device 16 sequentially outputs the currents I1 and I2 of the generated interharmonics at the fixed time intervals, i.e., every 30 minutes, and injects the same to the harmonic injection point a at the same time intervals.

In the embodiment under discussion, the targeted harmonic is the fifth harmonic (n=5). The frequencies f1 and f2 of the interharmonics are set at the frequencies of the 4.5th and 5.5th harmonics. Accordingly, the currents I1 and I2 of the interharmonics are those of the 4.5th and 5.5th harmonics.

The currents I1 and I2 of the interharmonics, which are injected into the harmonic injection point a, are not actually present in the electric power system 1. Therefore, even if the current injection device 16 is of the small current capacity type, the current levels of those currents are high enough to measure the harmonic characteristic of the power line located upstream and downstream from the harmonic injection point a.

An equivalent circuit of the high voltage bus 2 (for the interharmonics having the currents I1 and I2) located upstream from the harmonic measuring point b, and an equivalent circuit of the distribution bus 3 (for the same harmonics) located downstream from the harmonic injection point a, respectively consist of only admittances like the admittances 10 and 13 of the equivalent circuits 9 and 12, as taught by Norton's theorem.

For ease of explanation, it is assumed that an equivalent circuit of the high voltage bus extending upstream from the harmonic measuring point b is expressed as the upstream equivalent circuit 9, while neglecting the upstream line impedance 5 and the like. It is assumed that the currents of the interharmonics of the frequencies f1 and f2, which are derived from the harmonic injection point a and flows in the upstream direction, is denoted as Iiu (i=1, 2), and the voltage thereof is denoted as Viu (i=1, 2). An admittance Yiu (i=1, 2) of the equivalent circuit of the second high voltage bus 7, which is located upstream from the harmonic measuring point bis given by the following equation (1).

$$Yiu = Iiu/Viu \quad (1)$$

If the admittance (value) Yiu (Yiu=Y1u, Y2u) for the interharmonics of the frequencies f1 and f2 is known, the admittance (value) Yu(n) (=admittance 10) of the upstream equivalent circuit 9 for the targeted harmonic of the frequency (n×f$_s$) can be obtained by a simple interpolation; Yu(n)=(Y1u+Y2u)/2.

The admittance Yu(n) for the targeted harmonic is thus obtained. The current I(n) and voltage V(n) of the targeted harmonic are measured at the harmonic measuring point b. Substituting those values into the following equation (2), we have a current IGu(n) of the current source 11 of the equivalent circuit 9 for the targeted harmonic.

$$IGu(n) = I(n) - V(n) \; 33 \; Yu(n) \quad (2)$$

The admittance Yiu, (equation (1)), the admittance Yu(n), and the current IGu(n) of the current source 11 (equation (2)) are the values of the power line extending upstream from the high voltage bus 7. The admittance Yu(n) and the current IGu(n) may also be obtained in a manner that the related values are converted into the values of the admittance and current of the power line extending upstream from the high voltage bus 2, while considering the transformer ratio of the substation transformer 6.

When the voltage drop by the line impedance 5, for example, is taken into consideration, the admittance Yiu, the admittance Yu(n) and the current IGu(n) can be exactly obtained in their values.

To measure the admittance Yu(n), the current IGu(n) and the like, the primary side of a measuring transformer 17 is connected to the harmonic measuring point b, and a measuring current transformer 18 is connected to a point located upstream from and near the harmonic measuring point b. With this connection, the voltage and current of the electric power transmitted through the power system are measured at the harmonic measuring point b.

A voltage signal output from the measuring transformer 17 and a current signal from the measuring current transformer 18 are applied to an A/D converter 19 in the harmonic measuring device 15. The A/D converter 19 samples those signals and converts them into digital data.

To secure an exact frequency analysis to be performed in the subsequent stage, the sampling by the A/D converter 19 is carried out preferably in synchronism with the fundamental wave in the power system.

To this end, a sync control signal is transmitted, as a measuring command signal, from the synchronizing device to the A/D converter 19. When the currents I1 and I2 of the interharmonics are injected into the harmonic injection point a, the A/D converter 19 samples the output signals of the measuring transformer 17 and the measuring current transformer 18 in synchronism with the fundamental wave, i.e., the interharmonics, in response to the measurement command signal.

The sampling frequency of the A/D converter 19 is much higher than each of the frequencies f1 and f2 of the interharmonics.

The admittance 13 and the current source 14 of the downstream equivalent circuit 12 when the targeted harmonic flows therethrough may also be obtained in a similar manner. To this end, a measuring current transformer 20 is inserted into the current injection line ranging from the current injection device 16 to the harmonic injection point a. The measuring current transformer 20 measures the injection currents I1 and I2 of the interharmonics. The measured currents are sampled by the A/D converter 19.

The digital data output from the A/D converter 19 is applied to a signal processor 21. The digital data represents the values of the voltage and current of the electric power system, measured by the measuring transformer 17 and the measuring current transformer 18. Then, the digital data is subjected to a frequency analysis, e.g., DFT analysis or FFT analysis. The frequency analysis produces the voltage Viu and the current Iiu of the interharmonics of the frequencies f1 and f2, measured at the harmonic measuring point b.

The data of the voltage Viu and the current Iiu is applied to a computing unit 22. The computing unit 22 computes the admittance Yiu according to the equation (1) by use of the voltage Viu and the current Iiu.

Further, the computing unit 22 carries out the interpolation process by use of the admittance Yiu to determine the admittance 10 for the targeted harmonic, or the admittance Yu(n). In this way, a harmonic characteristic of the high voltage bus 2 located upstream from the harmonic measuring point bis measured.

Incidentally, in the present embodiment, according to the measurement of the harmonic characteristic, the current source 11 is determined so as to determine the equivalent circuit 9.

The harmonic measuring device 15 detects the end of the current injection of the interharmonics by, for example, a reception stop of the sync control signal. Then, the harmonic measuring device 15 actually measures the current I(n) and the voltage V(n) of the targeted harmonic in the electric power system 1 through a frequency analyzing process which the signal processor 21 carries out by use of the data derived from the A/D converter 19.

The computing unit 22 determines the current source (value) IGu(n), or the current source 11, for the targeted harmonic, according to the equation (2) by use of the determined admittance Yu(n) and the current I(n) and the voltage V(n), both being actually measured. In this way, the admittance Yu(n) and the current source IGu(n) of the upstream equivalent circuit 9 for the targeted harmonic are determined to specify the equivalent circuit.

Then, the computing unit 22 determines the circuit constants of the downstream equivalent circuit 12 located downstream from the harmonic injection point a. To this and, the computing unit 22 converts the values of the current Iiu and the voltage Viu into the values of the current and voltage of the interharmonics at the harmonic injection point a. The computing unit 22 computes the currents I1d and I2d of the interharmonics which flow downstream from the harmonic injection point a. In this case, the following calculations are performed: I1d=I1−I1u and I2d=I2−I2u where I1u and I2u (i.e., the current Iiu after the conversion) are the currents produced by the conversion calculation, and I1 and I2 are the injection currents actually measured.

The voltages V1d and V2d of the interharmonics of the frequencies f1 and f2, which result from the injection of their currents I1 and I2 and flow downstream from the harmonic injection point a, are equal to the voltage Viu (=V1u and V2u) after the conversion. Therefore, the admittance Yid (i=1, 2) of the downstream equivalent circuit 12 for the interharmonics of the frequencies f1 and f2 may be computed according to the equation (1) by use of the currents Id1 and Id2, and the after-conversion voltages V1u and V2u.

The value of the admittance 13 of the downstream equivalent circuit 12 for the targeted harmonic, i.e., the admittance Yd(n), is determined by an interpolation calculation using the admittance Yid, as in the case of the admittance 10, whereby a harmonic characteristic of the power line extending downstream from the distribution bus 3 is measured.

Based on the the admittance Yd(n) and the current I(n) and the voltage V(n) of the targeted harmonic, the current source 10 is determined as the current source Igd(n) by the similar calculation to the equation (2), so that the equivalent circuit 12 is specified by the admittance Yd(n) and the current source IGd(n).

The admittance Yu(n), Yd(n) and the current source IGu(n), IGd(n) are obtained every time the currents of the interharmonics of the frequencies f1 and f2 are injected to the harmonic injection point a. Thus, the upstream equivalent circuit 9 and the downstream equivalent circuit 12 are specified every injection of the currents of the interharmonics.

The results of the measurements are visually presented, on the screen of a display or monitor portion 23, in the form of an equivalent circuit diagram as shown in FIG. 1, while at the same time stored into a storage portion 24.

It is noted that the harmonic injection point a is located on the distribution bus 3, which is located downstream from the harmonic measuring point b on the high voltage bus 7. Because of this, the voltage rank of the current injection device 16 may be lower than in the case where the harmonic injection point a and the harmonic measuring point bare located at the same position. Since the voltage rank of the current injection device 16 is low, the device size is reduced and its protecting circuit is simplified.

Further, it is noted that the injected currents I1 and I2 are those of the interharmonics of the frequencies f1 and f2, which are not actually present in the electric power system 1. With this feature, a current injection device of small current capacity may be used for the current injection device 16, and hence the current injection device 16 may be reduced in size. This advantageous feature and its low voltage rank additively act to realize further size reduction and construction simplification. Thus, the current injection device 16 is improved in that its size is considerably reduced, its construction is simplified, and its cost to manufacture is reduced.

Accordingly, to measure the harmonic characteristic of the electric power system for the targeted harmonic, the harmonic measuring device 15, small and simple, may be used, and the harmonic measuring point b is set at a position. located upstream from the harmonic injection point a, and a harmonic characteristic of the power line extending upstream from the harmonic measuring point b is accurately measured.

Also in the measurement, a harmonic characteristic (for the targeted harmonic) of the power line extending downstream from the harmonic measuring point b may also be measured by the utilization of the harmonic characteristic of the upstream power line, already measured.

In the arrangement of the harmonic measuring device 15, the A/D converter 19, signal processor 21 and computing unit 22 may be implemented by a software technique in the computer field. In this case, the A/D converter 19, signal processor 21, computing unit 22, display portion 23 and storage portion 24 may be packed into a single computer device, e.g., a portable personal computer.

The output signals of the measuring transformer 17 and the measuring current transformers 18 and 20 may be transmitted to the A/D converter 19 in a wireless manner.

In the above-mentioned embodiment, the harmonic injection point a and the harmonic measuring point b may properly be set in the electric power system 1 such that the harmonic injection point a is located downstream from the harmonic measuring point b.

Therefore, those points may be set such that the harmonic measuring point b is set at a position on the distribution bus 3, and the harmonic injection point a is set on the secondary side of the pole transformer. If so set, a harmonic characteristic of the upstream power line including the distribution bus 3 may be measured by injecting the currents of the interharmonics into a position on the downstream power line. Thus, a harmonic characteristic of the upstream power line can be measured at a proper position on the downstream power line in the electric power system 11

In this cases the frequencies f1 and f2 of the interharmonics may be set at proper values of frequency if those are each a nonintegral number of the fundamental frequency, as a matter of course.

In an actual harmonic measurement, the current injection of the interharmonics is performed for each power line to determine the circuit constants of the upstream and downstream equivalent circuits.

The thus constructed harmonic measuring method of the invention has the following advantageous features.

The harmonic injection point a is set at a position downstream from the harmonic measuring point b on the power line in the electric power system 1. Therefore, the voltage rank of the current injection device 16 for injecting the currents I1 and I2 of the interharmonics having the frequencies f1 and f2 to the harmonic injection point a may be lowered than that of the current injection device used in the harmonic measuring method where the harmonic injection point a and the harmonic measuring point b are set at the same position on the power line. Accordingly, the protecting circuit for protecting the current injection device against high voltage voltage may also be simplified.

For this reason, the current injection device 16 may be reduced in size and simplified in construction.

In the high frequency measuring method of the present invention, the interharmonics of the frequencies f1 and f2, of which the currents are to be injected to the harmonic injection point a, are not present originally in the power line in the electric power system 1. To measure a harmonic characteristic in the electric power system 1, the currents of those interharmonics are injected to the harmonic injection point a from the current injection device 16; the currents and voltages of the injected interharmonics are measured at the harmonic measuring point b; the admittances of the equivalent circuit 9 of the power line extending upstream from the harmonic measuring point b when the interharmonics flow therethrough are obtained; the admittance of the equivalent circuit for the targeted harmonic is determined by use of the obtained admittances of the interharmonics; and the harmonic characteristic of the upstream power line for the targeted harmonic is measured.

Therefore, the high frequency measuring method of the invention can measure a harmonic characteristic of the power line for a targeted harmonic, which is located upstream from the harmonic measuring point b set at a position upstream from the harmonic injection point a, with small size and simple construction of the related device.

<Second Embodiment>

A second embodiment of the present invention will be described with reference to FIG. 2.

Figure 2:
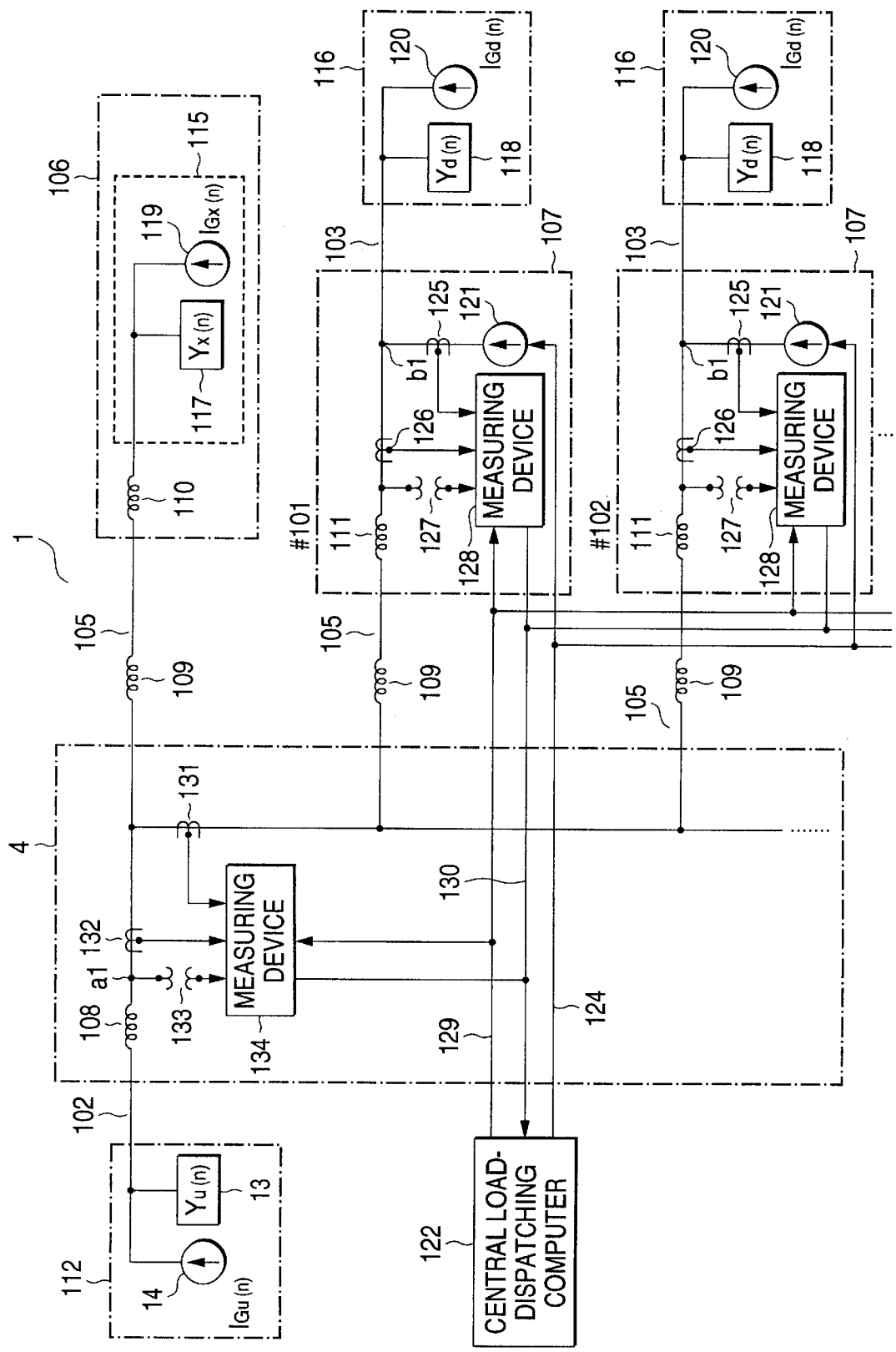
FIG. 2 is a circuit diagram showing a second embodiment of the present invention.

FIG. 2 is a single line system diagram showing how to measure a harmonic characteristic on a 77 kV high voltage bus 102 by a harmonic measuring method presented by the present invention. In the measurement, the currents of interharmonics of specific frequencies are injected to a position on each of 6.6 kV distribution buses 103, which are branched from the 77 kV high voltage bus 102 and located downstream from the latter in an electric power system 1.

A 77 kV electric power on the high voltage bus 102 is transformed into an electric power at 22 kV in voltage. Then, the 22 kV electric power is delivered into 22 kV high voltage buses 105.

Through the 22 kV high voltage buses 105, the high voltage power is distributed to an electric power consumer 106; and a power distribution substation 107 of #101, #102 ... The substations 107 transform each the received electric power into an electric power at 6.6 kV in voltage and distributes the resultant to the 6.6 kV distribution buses 103.

In FIG. 2, reference numeral 108 is a transformer impedance of a secondary substation 104; 109 is a line impedance of each of the 22 kV high voltage buses 105; 110 is an impedance of a power-reception transformer of the electric power consumer 106; and 111 is a transformer impedance of each of the power distribution substations 107.

Various higher harmonics are present in the electric power system 101. The frequencies of the higher harmonics are each an integral multiple of the frequency $f_s$ of a fundamental wave. An n-th harmonic is assumed to be a targeted harmonic in this embodiment. The frequency of the targeted harmonic is $n \times f_s$. An equivalent circuit 112 of the 77 kV high voltage bus 102 (i.e., an upstream power line) may be depicted as a parallel circuit consisting of an admittance 113 and a current source 114, as taught by Norton's theorem.

Similarly, an equivalent circuit 115 of the electric power consumer 106, for example, is a parallel circuit consisting of an admittance 117 and a current source 119, and an equivalent circuit 116 of each of the 6.6 kV distribution buses 103 (i.e., a downstream power line) is a parallel circuit consisting of an admittance 116 and a current source 120.

A harmonic measuring point a1 is set at a position on the 22 kV high voltage buses 105 within the secondary substation 104, for the purpose of measuring a harmonic characteristic of the 77 kV high voltage bus 102, which extends upstream from the 22 kV high voltage buses 105.

To effect this measurement, a harmonic injection point b1 is set at a position on the 6.6 kV distribution bus 103 to inject the currents of the interharmonics at frequencies f1 and f2 into the 6.6 kV distribution bus 103. To inject the currents of the interharmonics into all of those branched 6.6 kV distribution buses 103, the harmonic injection points b1 are set at positions on all the 6.6 kV distribution buses 103.

Current injection devices 121 of the inverter type are connected to the harmonic injection points b1, respectively, as shown. To measure the harmonic characteristic of the upstream power line, those current injection devices 121 are operated in synchronism with each other in response to a current injection command (to be described later) to inject the currents of the interharmonics of different frequencies into the harmonic injection points b1 at fixed time intervals, e.g., 30 minutes. The currents of the interharmonics are denoted as I1 and I2. The frequencies f1 and f2 of the interharmonics are located on both sides of the fundamental frequency $f_s$ of the fundamental wave when charted in frequency spectrum. The frequencies are each an integral multiple of the fundamental frequency $f_s$. Those frequencies f1 and f2 and the frequency ($=n \times f_s$) the targeted harmonic are related as follows et $f1 < n \times f_s < f2$.

To measure the harmonic characteristic, the currents I1 and I2 of the interharmonics are synchronously injected into the harmonic injection points b1 so that the interharmonics are in phase at the harmonic measuring point a1. The injected currents are added together into a large current, and the summed large current is fed to the upstream power line.

A central load-dispatching computer 123 of a central load-dispatching office 122 sends a current-injection command signal as a sync control signal to the current injection devices 121 by way of a communication cable 124. The central load-dispatching office 122 is provided separately from the secondary substation 104 and the power distribution substations 107.

The current injection device 121 is provided in each of the power distribution substations 107. The currents of the interharmonics that are injected to the harmonic injection point b1 of the power distribution substation 107, are measured by a measuring current transformer 125. The current and voltage of the electric power (transmitted by of the electric power system 1) flowing through the harmonic injection point b1 (referred simply to power current and power voltage) are measured by a measuring current transformer 126 and a measuring transformer 127, respectively. The output signals of the current transformers 125 and 126 and the transformer 127 are input to a measuring device 128.

Each measuring device 128 operates in response to a measurement command signal received through a communication cable 129 from the central load-dispatching computer 123. In the measurement of the harmonic characteristic of the upstream power line, the measuring device 128 fetches from the measuring current transformer 125 injection information or the measuring information of the currents of the interharmonics of the frequencies f1 and f2, which are injected by the current injection devices 121, and further fetches the information of the power voltage and power current from the measuring current transformer 126 and the measuring transformer 127, and sends those pieces of information to the central load-dispatching computer 123 via a communication cable 130.

The central load-dispatching computer 123 has many functions for the harmonic measurement, for example, the synchronous control and various information gathering. Specifically, the central load-dispatching computer 123 sends a current injection command signal to the current injection devices 121 at the current injection timings of the currents I1 and I2 of the interharmonics, to thereby instruction the injection devices to inject those currents At the same time, the central load-dispatching computer 123 performs the synchronous control to control the phases of the currents I1 and I2 when those are injected by the current injection devices 121.

In a simple injection current phase control, a reference current injection device is selected from those current injection devices. In the instant case, the first current injection device 121 (referred to as a #101 current injection device) of the first or #101 power distribution substation 107 is used as the reference current injection device. The phases of the currents of the interharmonics injected by the remaining current injection devices 121 are set at the phases of the injection currents by the #01 current injection device 121.

To be more specific, as a first step, the central load-dispatching computer 123 sends current injection and measurement commands to the #101 current injection devices 121 the measuring device 128 in the #101 current injection device 121, at the timing of the currents I1 and I2 of the interharmonics.

In the #101 power distribution substations 107, the #101 current injection device 121 injects the current I1 or I2 into the harmonic injection points b1, the measuring device 128 coupled with the distribution buses 103 detects the injected current, and sends injection information and others to the central load-dispatching computer 123.

As a second step, the central load-dispatching computer 123 sequentially sends current injection and measurement commands to the current injection devices 121 and the measuring device 128 in the remaining power distribution substations 107, and those current injection devices 121 inject the current I1 or I2 into the harmonic injection points b1.

The central load-dispatching computer 123 processes the injection information and others received from the remaining measuring device 128 so that the currents I1 or I2 of the interharmonic injected by the remaining current injection devices 121 match in phase the current I1 or I2 of the interharmonic injected by the reference or #101 current injection device 121, and produces phase correction data. Further, it sends the phase correction data as phase correction command signals to the remaining current injection devices 121.

Under control of the phase correction command signals, the currents I1 or I2 of the interharmonics injected by the remaining current injection devices 121 are synchronized with the current I1 or I2 by the #101 current injection device 121, and in this state the former currents I1 or I2 are injected into the harmonic injection points b1.

In this case, the interharmonics have different frequencies f1 and f2, as a matter of course. In the second embodiment under discussion, the targeted harmonic is the fifth harmonic (n=5). The frequencies f1 and f2 of the interharmonics are set at the frequencies of the 4.5th and 5.5th harmonics. Accordingly, the currents I1 and I2 of the interharmonics are those of the 4.5th and 5.5th harmonics.

The currents I1 or I2 of the interharmonics are injected into the harmonic injection points b1, and flows downstream and upstream of the power line. Those currents directed upstream flow through the secondary side (low voltage side) of the transformers of the power distribution substations 107, the primary side (high voltage side) of which the number of turns of the winding is larger, and the high voltage buses 105, and added together at a position on the downstream side (load side) of the harmonic measuring point a1 in the secondary substation 104.

The resultant current I1 or I2 of the composed interharmonic is measured by a measuring current transformer 131 within the secondary substation 104, and part of the resultant current flows to the electric power consumer 106, while the remaining part flows further upstream from the harmonic measuring point a1.

Within the secondary substation 104, the current I1 or I2 of the interharmonics thus added together flows through a measuring current transformer 132 located just before the harmonic measuring point a1 and a measuring transformer 133 inserted between the harmonic measuring point a1 and a measuring device 134. The current and voltage of the composed harmonic are measured by those transformers.

It is noted that even if the current injection devices 121 placed in the power distribution substations 107 are each of the small current capacity type, the current I1 or I2 flowing at the harmonic measuring point a1 is large enough to measure since it is the result of adding together the currents I1 of the interharmonics derived from the power distribution substations 107.

The currents I1 and I2 of the interharmonics are not actually present in the electric power system 101. Therefore, if the currents I1 and I2 are smaller than the currents of the higher harmonics present in the electric power system 101, their current levels are high enough to reliably perform a frequency analysis (to be given later) for the extraction of intended information.

The measuring signals output from the measuring current transformers 131 and 132 and the measuring transformer 133 are input to the measuring device 134 provided as a harmonic characteristic measuring device within the secondary substation 104. The central load-dispatching computer 123 sends a measurement command signal to the measuring device 134 via a communication cable 129. In response to this command signal, the measuring device 134 processes the measuring signals to construct an equivalent circuit of the high voltage bus 102 located upstream from the harmonic measuring point a1 when the interharmonics of the frequencies f1 and f2 flow therethrough, and then constructs an equivalent circuit of the same power line for the targeted harmonic.

The computing process performed by the measuring device 134 will be described.

An equivalent circuit of the 77 kV high voltage bus 102 for the interharmonics of the frequencies f1 and f2 consists of only an admittance like the admittance 113 if it is depicted in terms of Norton's theorem.

An equivalent circuit of the electric power consumer 106 (the load side) located downstream from the harmonic measuring point a1, when the interharmonics of the frequencies f1 and f2 flow therethrough, consists of only an admittance. Similarly, an equivalent circuit of the power line extending downstream from the harmonic injection point b1 in each power distribution substation 107 also consists of only an admittance.

For ease of explanation, it is assumed that the transformer impedance 108 of the secondary substation 104 is neglected, the equivalent circuit 112 represents an equivalent circuit of the 77 kV high voltage bus 102 extending upstream from the harmonic measuring point a1 when the targeted harmonic flows therethrough, and the interharmonic of the frequency f1 or f2 has current Iiu (i=1, 2) and voltage Viu (i=1, 2) at the harmonic measuring point a1.

An admittance Yiu (i=1, 2) of the upstream equivalent circuit for the interharmonic of the frequency f1 or f2 is given by the following equation.

$$Yiu = Iiu/Viu \quad (3)$$

Since the admittance Yiu is thus obtained, the admittance Yu(n) (designated by numeral 113) of the equivalent circuit 112 for the targeted harmonic of the frequency $(n \times f_s)$, which in the intermediate between the frequencies f1 and f2 of the interharmonics, can be obtained by a simple interpolation: $Yu(n) = (Y1u + Y2u)/2$.

The admittance Yu(n) of the equivalent circuit 112 for the targeted harmonic is thus obtained. The current Iu(n) and voltage Vu(n) of the targeted harmonic are actually measured at the harmonic measuring point a1. Then, a current source IGu(n) (designated by numeral 114) of the equivalent circuit 112 for the targeted harmonic may be computed by the following equation.

$$IGu(n) = Iu(n) 31 \; Vu(n) \times Yu(n) \quad (4)$$

To compute the equations (3) and (4), the central load-dispatching computer 123 sends a characteristic measurement command signal to the measuring device 134 via the communication cable 129 when the currents I1 and I2 of the interharmonics are injected. In response to the command signal, the measuring device 134 fetches the measuring signals of the measuring current transformer 132 and the measuring transformer 133 during the injection of the currents I1 and I2.

In the embodiment under discussion, a harmonic characteristic of the electric power consumer 106 is measured. Therefore, the measuring device 134 fetches a measuring output signal of the measuring current transformer 131.

The measuring signals of the measuring device 134 are sampled and converted into digital data by an A/D converter.

To secure an exact frequency analysis to be performed in the subsequent stage, the sampling by the A/D converter is carried out preferably in synchronism with the fundamental wave in the power system in response to a synchronous signal output from the central load-dispatching computer 123.

The sampling frequency of the A/D converter is much higher than each of the frequencies f1 and f2 of the interharmonics.

The digital data output from the A/D converter is applied to a signal processor at the subsequent stage. The digital data is subjected to a frequency analysis, e.g., DFT analysis or FFT analysis. The frequency analysis produces the voltage Viu and the current I1u of the interharmonics of the frequencies f1 and f2, measured at the harmonic measuring point a1.

The data of the voltage Viu and the current I1u is applied to a computing unit. The computing unit computes the admittance Yiu according to the equation (3) by use of the voltage Viu and the current Iiu. Further, the computing unit carries out the interpolation process by use of the admittance Yiu to determine the admittance 13 for the targeted harmonic, or the admittance Yu(n). In this way, a harmonic characteristic of the high voltage bus 102 located upstream from the harmonic measuring point a1 is measured.

By the measurement of the harmonic characteristic, the current source 114 is also determined, so the circuit constants of the current source 114 are determined. Therefore, for example, immediately after the injection of the currents I1 and I2 of the interharmonic ends, the measuring device 134 actually measures the current Iu(n) and the voltage Vu(n) of the targeted harmonic present in the electric power system 1 through a frequency analyzing process which the signal processor carries out by use of the data derived from the A/D converter.

The computing unit determines the current source IGu(n), or the current source 111, for the targeted harmonic, according to the equation (4) by use of the determined admittance Yu(n) and the current Iu(n) and the voltage Vu(n), both being actually measured.

It is assumed that the current of each of the interharmonics of the frequencies f1 and f2 that are derived from the measuring data from the measuring current transformer 131 is generally represented by Iia (i=1, 2), and part of the current Iia flows into the electric power consumer 106 is represented by Iix (i=1, 2). The current Iix is given by the following equation (5).

$$Iix = Iia - Iiu \quad (5)$$

The voltages of the interharmonics of the frequencies f1 and f2 in the electric power consumer 106, when measured from the harmonic measuring point a1, are equal to the voltage Viu. Therefore, the measuring device 134 computes an admittance Yix (i=1, 2) of the electric power consumer 106 for the interharmonics of the frequencies f1 and f2 according to the equation which converts the current Iiu of the equation (3) into the current Iix, by use of the current Iix and the voltage Viu.

Further, the measuring device 134 determines the admittance 117 of the electric power consumer 106 for the targeted harmonic by an interpolation given by (Y1x+Y2x)/2.

To obtain the current Ix(n) of the targeted harmonic in the electric power consumer 106, the measuring signals of the measuring current transformers 131 and 132 are frequency analyzed immediately after the currents I1 and I2 of the interharmonics are injected, to thereby extract the currents Iu(n) and Iy(n) from the measuring signals, and either of the following equations is selected depending on the current flowing direction and calculated.

$$Ix(n) = |Iu(n) - Iy(n)| \text{ or } Ix(n) = |Iu(n) + Iy(n)|$$

Since the voltage Vx(n) of the targeted harmonic in the electric power consumer 106 is equal to the voltage Vu(n), the current source IGx(n) of the equivalent circuit 115 is computed according to the equation (4) for converting Iu(n) and Yu(n) into Ix(n) and Yx(n). In this way, the admittance Yx(n) and the current source IGx(n) of the equivalent circuit 115 are determined in their values.

The admittance Yiu (equation (3)), the admittance Yu(n), and the current source IGu(n) (equation (4)) are the circuit constants of the power line extending upstream from the 22 kV high voltage buses 105. The values of the admittance Yu(n) and the current source IGu(n) may be converted into the values of those components in the power line extending upstream from the 77 kV high voltage bus 102 including the electric power consumer 106 and the like.

The results of the measurement by the measuring device 134 are transmitted as measurement information on the higher part of the power line to the central load-dispatching computer 123 via the communication cable 130.

To improve the measuring function, the present embodiment has a function of measuring a downstream harmonic characteristic as well as the function of measuring the upstream harmonic characteristic.

To this end, the harmonic characteristic like that of the measuring device 134 is assigned to each measuring device 128. A harmonic characteristic (referred to as a downstream harmonic characteristic) of each of the 6.6 kV distribution buses 103 located downstream from the harmonic injection points b1 is measured for the targeted harmonic.

To measure the downstream harmonic characteristic, the central load-dispatching computer 123 sends a measuring-mode switch command signal to the measuring devices 128 and the measuring device 134 via the communication cable 129. Upon receipt of the command signal, those measuring devices switch their measuring mode from an upstream harmonic-characteristic measuring mode to a downstream harmonic-characteristic measuring mode.

Further, the central load-dispatching computer 123 sends a command signal to the measuring devices 128. The command signal individually commands the measuring devices 128 to carry out their downstream harmonic characteristic measurement. The central load-dispatching computer 123 sends another command signal to the current injection devices 121 via the communication cable 124, to thereby cause the current injection devices 121 to inject the interharmonic currents into the harmonic injection points b1.

To measure a harmonic characteristic of the downstream or #101 distribution buses 103 of the #101 power distribution substation 107, its current injection device 121 injects the currents I1 and I2 of the interharmonics into its harmonic injection point b1. The injected current I1 or I2 flows upstream and downstream from the harmonic injection point b1.

The currents I1 and I2 of the interharmonics that are injected at the harmonic injection point b1 are measured by the measuring current transformer 125. Those currents flowing upstream from the harmonic injection point b1 are measured by the measuring current transformer 126.

The voltage Vid (i=1, 2) of the interharmonic of the frequency f1 or f2 on the #101 distribution bus 103 is measured by the measuring transformer 127

The output signals of the measuring current transformers 125 and 126 and the measuring transformer 127 are fed into the measuring device 128 of the #101 power distribution substation 107. In the measuring device 128, the A/D converter, the signal processor and the computing unit operate to determine the circuit constants of the equivalent circuit 115 of the #101 6.6 kV distribution bus 103 as in the case of determining the circuit constants of the equivalent circuit 115 of the electric power consumer 106.

The differences between the currents I1 and I2 contained in the output signals of the measuring current transformers 125 and 126 are calculated to produce the currents I1 and I2 (generally denoted as Iid (i=1, 2)) of the interharmonics flowing downstream from the harmonic injection point b1. The current Iid and the voltage Vid, thus obtained, are substituted into an equation similar to the equation (3), to produce an admittance Yid (i=1, 2) of the #101 distribution bus 103 for the interharmonica of the frequencies f1 and f2. An interpolation process using the thus obtained admittance Yid is carried out to determine an admittance (value) Yd(n) of the admittance 118 of the equivalent circuit 116.

Immediately after the currents I1 and I2 are injected, the current Id(n) and the voltage Vd(n) of the #101 distribution bus 103 for the targeted harmonic are measured by the measuring current transformer 126 and the measuring transformer 127. The thus obtained admittance Yd(n), current Id(n) and voltage Vd(n) are substituted into an equation similar to the equation (4) to determine a current source Igd(n) of the current source 120 of the equivalent circuit 116. As a result, the circuit constants of the equivalent circuit 116 of the #101 6.6 kV distribution bus 103 are determined.

The circuit constants of the remaining equivalent circuits 116 of the remaining distribution buses 103 may also be obtained in a similar way. To obtain them in the #102 power distribution substation 107, for example, its current injection device 121 injects the currents I1 and I2 of the interharmonics of the frequencies f1 and f2 into the harmonic injection point b1 of its distribution bus 103. And its measuring device 128 determines the value (=Yd(n)) of the admittance 118 and the value (=IGd(n)) of the current source 120 of its equivalent circuit 116. The same thing is correspondingly applied to the determining of the circuit constants of the equivalent circuits of other distribution buses 103.

The results of the measurement thus obtained are transmitted from the measuring device 128 via the communication cable 130 to the central load-dispatching computer 123, and visually presented on the monitor screen as the measurement information on the upstream side is done.

In the second embodiment under discussion, harmonic injection points b1 are set in some or all of the 6.6 kV distribution buses 103 branched downstream from the harmonic measuring point A. The currents I1 and I2 of the interharmonics at the frequencies f1 and f2, which are needed for the measurement at the harmonic measuring point a1, are injected, in synchronized manner, from the harmonic injection points b1 by the current injection devices 121 coupled with the distribution buses 103. As a result, the current Iiu (i=1, 2) of the interharmonic that appears at the harmonic measuring point a1, is high enough to measure.

The harmonic components of the currents I1 and I2 are not originally present in the electric power system 101. Therefore, if the current Iiu and the voltage Viu of the interharmonic that are present at the harmonic measuring point a1 a are relatively low in their levels, those current and voltage are little affected by the harmonics present in the electric power system 101. Therefore, it is possible to exactly determine the values of the admittance 113 and the current source 114 (for the targeted harmonic) of the equivalent circuit 112 of the upstream high voltage bus 102. To determine those circuit constants, the admittance values of the upstream equivalent circuit for the interharmonics of the frequencies f1 and f2 are obtained, and the admittance values are mathematically processed for interpolation.

With use of the interharmonics not present in the electric power system 101, the current injection device 121 used may have a lower voltage rank than that used in such a measuring method that the harmonic measuring point a1 is set at the harmonic injection point b1. Therefore, the current injection device 121 may be of the small current capacity type. For this reason, the harmonic measuring method of the second embodiment can exactly measure the harmonic characteristic of the upstream power line in the electric power system 101 by use of the current injection devices 121 of the low voltage rank and the small current capacity.

In the harmonic measuring method of the embodiment, it is noted that the currents I1 and I2 of the interharmonics are injected at different harmonic injection points b1. Therefore, the harmonic measuring method is free from the harmonic interference problem caused when the intermediate large currents of the harmonics are injected in a concentrated fashion.

Further, the harmonic measuring method is capable of measuring a harmonic characteristic of the electric power consumer 106 who consumes large electric power, connected to the high voltage buses 105 In this case, the measuring device 134 is used, and the output signals of the measuring current transformers 131 and 132, and the measuring transformer 133.

The harmonic measuring function is assigned to each of the measuring devices 128, which are located in the vicinity of the harmonic injection points b1. The measuring device 134 has such a harmonic measuring function, as a matter of course. With the measurement of the measuring devices 128, the injection currents by the current injection devices 121 may be synchronized in phase with one another. Additionally, the harmonic characteristics of the power lines extending downstream from the harmonic injection points EL may be measured line by line.

The harmonic measuring point a1 may be set at a desired position in the electric power system 101. In this case, the harmonic injection points b1 may be set on the power lines branched downstream from the power line containing the harmonic measuring point a1. The number of harmonic injection points b1 and the positions at which the harmonic injection points b1 are set may be properly selected.

The current injection device 121, central load-dispatching computer 123, and the measuring devices 128 and 134 may take any forms. The current capacities of the current injection devices 121 may be different from one another.

The central load-dispatching computer 123 may be constructed integral with the measuring device 134. A wireless communication may be used for the communication between the central load-dispatching computer 123 and the measuring devices 128 and 134.

A fuzzy control may be employed for the phase control of the current injection by the current injection devices 121. The least square method may be used for the interpolation for obtaining the admittance for the targeted harmonic.

The useful effects of the second embodiment of the invention thus far described will be described below.

The harmonic injection points b1 are set on the distribution buses (6.6 kV distribution buses 103) branched downward from the power line on which the harmonic measuring point a1 is set. The currents of the interharmonics used for the measurement at the harmonic measuring point a1 result from the currents of the interharmonics injected at the different harmonic injection points b1.

The voltage rank of each of current injection devices 121 located near the harmonic injection points b1 may be low. The current capacity of the current injection device 121 is lower than when one harmonic injection point is used and one current injection device is used. Therefore, the current injection device of low voltage rank and small current capacity may be used for the harmonic measurement.

The currents of the interharmonics are injected at different points. This feature eliminates the harmonic interference problem.

The current injection devices 121 inject the currents of the interharmonics to the harmonic injection points in a synchronous manner. The interharmonic currents thus injected are added together, and the resultant current, large in level, is fed to a point downstream from the harmonic measuring point a1. A harmonic characteristic measuring device (measuring device 134) accurately measures the current and voltage of the interharmonic at the harmonic measuring point a1, and obtains the value of the admittance of an equivalent circuit of the power line located upstream from the harmonic measuring point a1.

The interharmonics of the frequencies f1 and f2 are not present originally in the electric power system 101 The measurement of the admittance of the equivalent circuit is free from the adverse influence by the harmonics in the electric power system 101.

In the harmonic measuring method of the second embodiment, the admittance of the equivalent circuit 112 located upstream from the harmonic measuring point a1, which is for the targeted harmonic, is determined on the basis of the admittance of the equivalent circuit for the interharmonics, and the harmonic characteristic of the power line expressed by the equivalent circuit is determined on the basis of the admittance of the equivalent circuit. Therefore, each current injection device 121, which is low in voltage rank and small in current capacity, may be used. No harmonic interference takes place, and the measurement of the harmonic characteristic for the targeted harmonic is exact.

<Third Embodiment>

A third embodiment of the present invention will be described with reference to FIG. 3.

Figure 3:
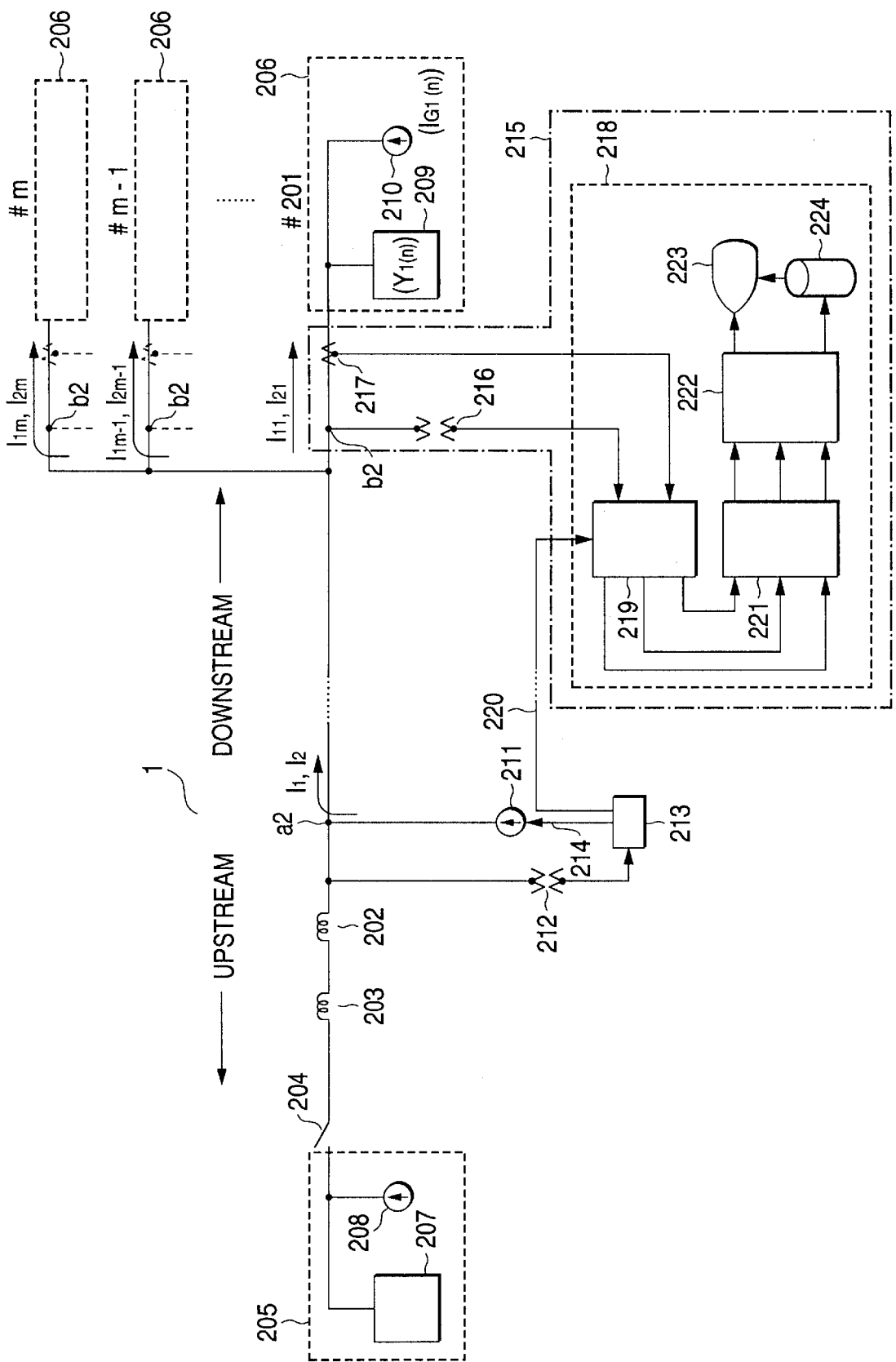
FIG. 3 is a circuit diagram showing a third embodiment of the present invention.

FIG. 3 shows an equivalent of an electric power system 201 expressed in the form of a single line system. In the figure, a harmonic injection point a2 is set at a proper position in the electric power system 201. It is preferable that the position is near a position on the power line to which a low-pass filter for harmonics is connected.

Various higher harmonics are present in the electric power system 201. The frequencies of the harmonics are each an integral multiple of the frequency $f_s$ of the fundamental wave of the electric power transmitted by the electric power system 201. The frequency of each higher harmonic is $n \times f_s$ (n=positive integer). An upstream equivalent circuit 205 of the power line extending upstream from the harmonic injection point a2 is connected to the harmonic injection point a2 while a transformer impedance 202, an upstream power line impedance 203, and a circuit breaker 204 are inserted between the upstream equivalent circuit 205 and the harmonic injection point a2.

The power line is branched downstream into a plural number of power lines at the harmonic injection point a2. Those branched power lines are expressed in the form of equivalent circuits 206.

Norton's theorem teaches that the upstream equivalent circuit 205 is a parallel circuits consisting of an admittance 207 and a current source 208, and that each downstream equivalent circuit 206 is a parallel circuit consisting of an admittance 209 and a current source 210, Usually, the current source 210 is not actual, but is caused by current distortion and the like by the load connected to the power line.

In the third embodiment, a targeted harmonic is the fifth harmonic (n=5) of the higher harmonics in the electric power system 201. The harmonic characteristic of each equivalent circuit 206 for the targeted harmonic is measured by determining the circuit constants, which are varying time to time, of the equivalent circuit 206. To the measurement, a current injection device 211 of the PLL controlled oscillator type is connected to the harmonic injection point a2.

A measuring transformer 212 is coupled to the electric power system 201. The secondary side of the measuring transformer 212 is connected to a synchronizing signal generator 213. The synchronizing signal generator generates a synchronizing (sync) signal synchronized with a fundamental wave of an electric power transmitted in the electric power system 201. The sync signal is periodically or continuously supplied as an injection command signal to the current injection device 211 via a communication cable 214 as a communication means.

Upon receipt of the sync signal, the current injection device 211 operates in synchronism with the fundamental wave of the electric power to inject the currents of interharmonics of different frequencies f1 and f2 into the harmonic injection point a2 at fixed time periods every measuring period of 30 minutes. The frequencies f1 and f2 of the interharmonics are each a nonintegral multiple of the frequency $f_s$ of the fundamental wave. The frequency ($n \times f_s$) of a targeted harmonic is the intermediate between the frequencies f1 and f2 of the interharmonics. Those frequencies are: f1<$n \times f_s$<f2.

The fifth harmonic (frequency=$5 \times f_s$ since n=5) is used as the targeted harmonic. The frequencies f1 and f2 of the interharmonics are set at the frequencies of the 4.5th and 5.5th harmonics. The frequency of the 4.5th harmonic is $4.5 \times f_s$ since n=4.5, and the frequency of the 5.5th harmonic is $5.5 \times f_s$ since n=5.5. Those interharmonics are not present originally in the upstream equivalent circuit 205

The currents I1 and I2 of the interharmonics having the frequencies f1 and f2, which are injected at the harmonic injection point a2, is distributed into m number of downward branch power lines #201, ... #m–1, #m in accordance with ratios depending on load conditions Accordingly, the currents I11, ... , I1m–1, I1m of the interharmonic of the frequency f1 flow through the branch power lines at voltage V11, ... , V1m–1, V1m, respectively Similarly, the currents I21, ... , I2m–1, I2m of the interharmonic of the frequency f2 flow through the branch power lines at voltage V21, ... , V2m–1, V2m, respectively.

The interharmonics of the frequencies f1 and f2 are not present or not contained in the harmonics of the electric power in the electric power system. Therefore, the equivalent circuit of each branch power line for the interharmonics consists of only the admittance, or is equivalent to the admittance 209 consisting of only the admittance 209.

The current I11 and voltage V11 of the interharmonic having the frequency f1 flowing through the branch power line #201 are measured. substituting the measured current and voltage values into the following equation (6), then we have an admittance (value) Y11 of the equivalent circuit 206 of the branch power line #201.

$$Y11 = I11/V11 \quad (6)$$

The admittance (value) Y21 of the equivalent circuit for the frequency f2 may also be obtained in a similar manner of the equation (6).

Since the admittance values Y11 and Y21 for the interharmonics of the frequencies f1 and f2 are thus known, the admittance (value) Y1(n) (=admittance 209) of the equivalent circuit for the targeted harmonic whose frequency is n×$f_s$ can be obtained by a simple interpolation given by (Y11+Y21)/2.

The current source value IG1(n) (=current source 210) of the equivalent circuit 206 for the targeted harmonic is given by the following equation (7).

$$IG1(n) = I1(n) - V1(n) \cdot Y1(n) \quad (7)$$

In the above equation, the admittance value Y1(n) is known since it is obtained as mentioned above, and the current I1(n) and voltage V1(n) of the targeted harmonic flowing through the branch power line #201 are measured.

The value of the current source 210 of the equivalent circuit 206 of each of the remaining branch power lines can be computed as of the branch power line #101.

In the present embodiment, harmonic measuring points b2 are set at positions on the branch power lines, which are near the branching point.

In the sequential measurements of the harmonic characteristics of the branch power lines 206, when the harmonic characteristic of the branch power line #201 is measured, a harmonic measuring device 215, which is separate from the current injection device 211, is positioned near the harmonic measuring point b2 on the branch power line #201.

The primary side of a measuring transformer 216 of the harmonic measuring device 215 is connected to this harmonic measuring point b2. A measuring current transformer 217 is provided at a position downstream from and near to the harmonic measuring point b2. The current and voltage of the electric power flowing through the harmonic measuring point b2 are measured by those transformers.

The current and voltage of the electric power thus measured or detected are transferred to an A/D converter 219 incorporated into a measuring circuit 218 of the harmonic measuring device 215, The A/D converter 219 samples the received current and voltage signals to convert them into digital measuring data.

To secure an exact frequency analysis to be performed in the subsequent stage, the sampling by the A/D converter 129 is carried out preferably in synchronism with the fundamental wave of the electric power when the current of the interharmonic is injected into the harmonic injection point a2.

A sync signal is sent as a measurement command signal from the synchronizing signal generator 213 to the A/D converter 219 via a communication cable 220 as a wire communicating means. The A/D converter 219 samples the voltage and current signals output from the measuring transformer 216 and the measuring current transformer 217 in synchronism with the fundamental wave of the electric power or the interharmonics, when the currents of the interharmonics are injected to the harmonic injection point a2.

The sampling frequency of the A/D converter 219 is much higher than each of the frequencies f1 and f2 of the interharmonics.

The measuring data on the voltage and current of the electric power is transferred from the A/D converter 219 to the signal processor 221. The signal processor processes the measuring data by a digital frequency analysis, e.g., DFT analysis or FFT analysis, to extract the voltages V11 and V21 and the currents I11 and I21 of the interharmonics of the frequencies f1 and f2 at the harmonic measuring point b from the measuring data.

The data on the voltages V11 and V21 and the currents I11 and I21 of the interharmonics, thus detected, is transferred to the computing unit 222. The computing unit calculates the equation (6) by using the voltage and current data to determine the admittance (values) Y11 and Y21 of the branch power line #201.

The interharmonics of the frequencies f1 and f2 are not contained in the harmonics in the electric power system 201. Therefore, the calculated admittance values Y11 and Y21 are exact even if the amounts of the injected currents are small.

A current injection device of a small current capacity may be used for the current injection device 211. Therefore, the measuring device incorporating the current injection device 211 may be reduced in sizer weight and cost.

Then, the value (admittance Y1(n)) of the admittance 209 of the branch power line #201 for the targeted harmonic is determined by the interpolation operation, and a harmonic characteristic of the same branch is obtained using the admittance Y1(n).

The harmonic characteristic is thus measured and then the value of the admittance 10 of the equivalent circuit 206 is determined to thereby specify the equivalent circuit 206 of the branch power line #201.

The harmonic measuring device 215 detects the end of the current injection of the interharmonics by, for example, a reception stop of the sync signal from the synchronizing signal generator 213. Then, the harmonic measuring device 215 actually measures the current I(n) and the voltage V(n) of the targeted harmonic on the branch power line #201, through a frequency analyzing process which the signal processor 201 carries out by use of the digital data derived from the A/D converter 219.

The computing unit 222 determines the current source (value) IG1(n), or the current source 11, for the targeted harmonic, according to the equation (7) by use of the determined admittance Y1(n) and the current I1(n) and the voltage V1(n), both being actually measured. In this way, the admittance Y1u(n) and the current source IG1u(n) of the equivalent circuit 206 for the targeted harmonic are determined to specify the equivalent circuit 206.

The admittance Y1(n) and the current source IG1(n) are obtained every time the currents of the interharmonics are injected, as in the above manner. In this way, the updated equivalent circuit 206 of the branch power line #201 for the targeted harmonic is iteratively specified.

The results of the measurements are visually presented, on the screen of a display or monitor portion 223, in the form of an equivalent circuit diagram as shown in FIG. 3, while at the same time stored into a storage portion 224.

A harmonic characteristic on another branch power line is also measured in a similar manner; the harmonic measuring device 215 is set at the harmonic measuring point b2 of the branch power line to be measured; the harmonic measuring device 215 determines the values of the admittance 209 and the current source 210 as in the case of the branch power line #201, while receiving a sync signal from the synchronizing signal generator 213 via the communication cable 220, whereby the equivalent circuit 206 is specified.

Thus, the harmonic characteristics of the branch power lines located downstream from the harmonic injection point a2 are individually measured by the harmonic measuring device 215, which is separate from the current injection device 211, while using the current injection device 211 as a common current injection device.

The interharmonics of the frequencies f1 and f2, which are not contained in the harmonics in the electric power system 201, are injected into the power line. And the admittance 209 and the current source 210 of the power line for the targeted harmonic $n \times f_s (f1 < n \times f_s < f2)$ are determined by use of the result of the measurement of the interharmonics to thereby specify the admittance 209. Therefore, the harmonic characteristics of the branch power lines obtained on the basis of the actual measurement are exact.

In the arrangement of the harmonic measuring device 215, the A/D converter 219, signal processor 221 and computing unit 222 may be implemented by a software technique in the computer field.

In this case, the harmonic measuring device 215, except the measuring transformer 216 and the measuring current transformer 217, may be realized by a portable personal computer. If so done, the harmonic measuring device 215 may easily be transported to the harmonic measuring point b2 of each of the branch power lines.

When the harmonic characteristics of some or all the branch power lines are measured, the harmonic measuring devices 215 are coupled with the harmonic measuring points if of the branch power lines to be measured, and those characteristics are measured concurrently.

Communication means for transmitting the sync signal from the synchronizing signal generator 213 and the current injection device 211 may be wire or wireless communication means, as a matter of course.

The synchronizing signal generator 213 may be placed at any position in the electric power system 201. If required, the synchronizing signal generator 213 may be constructed integral with the current injection device 211 or the harmonic measuring device 215. In this case, the communication cable 214 or 220 may be omitted.

The harmonic injection point a2 and the harmonic measuring point b2 may be set at desired positions in the electric power system 201 in accordance with the measuring purpose and the like.

There is a case where a plural number of upstream power linen are coupled to the harmonic injection point a2. In this case, to measure the harmonic characteristics of those upstream power lines, the harmonic measuring points b2 are set on those upstream power lines, respectively. The admittance (value) and the current source (value) of each of those power lines are determined as in the above case for the downstream power lines 206 (FIG. 3) to thereby determine its equivalent circuit.

<Fourth Embodiment>

A fourth embodiment of the present invention will be described with reference to FIG. 4.

Figure 4:
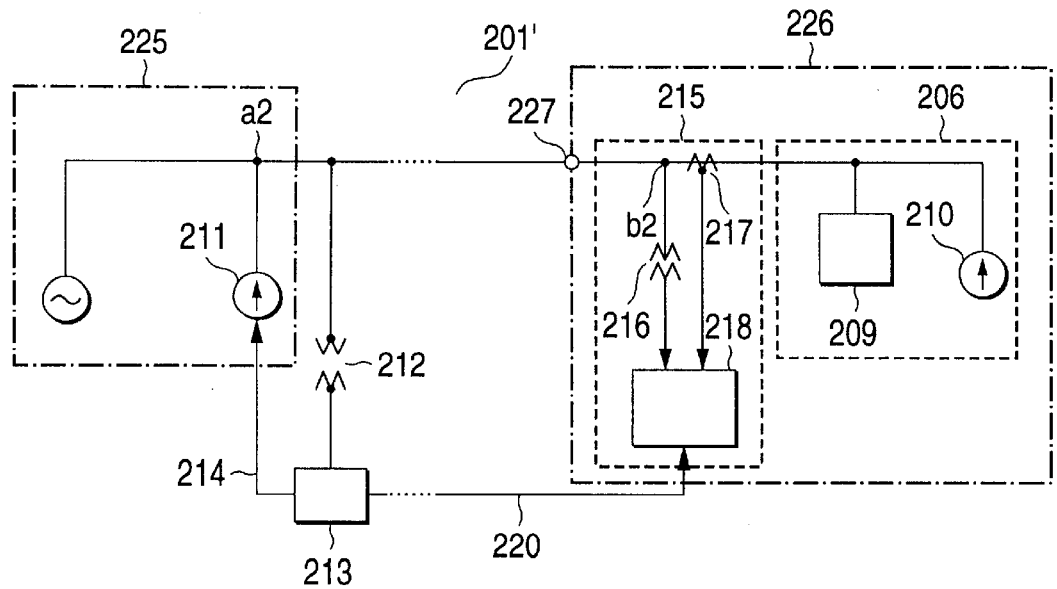
FIG. 4 is a circuit diagram showing a fourth embodiment of the present invention.

FIG. 4 shows a diagram showing a measuring circuit to measure the harmonic characteristic of each electric power consumer by a harmonic measuring method according to the fourth embodiment of the present invention. As shown, a harmonic injection point a2 is set at a power supplying terminal of a distribution substation 225 in an electric power system (power distribution system) 201l. A harmonic measuring point b2 is set at the power receiving terminal of each electric power consumer 226 to be measured.

In FIG. 4, like reference numerals designate like or equivalent portions in FIG. 3, and numeral 227 designates the power receiving terminal of each electric power consumer 226.

The current injection device 211 injects the currents of the interharmonics of the frequencies f1 and f2 into the harmonic injection point a2. The harmonic measuring device 215 coupled to the harmonic measuring point b2 determines the admittance (value) and the current source (value) of an equivalent circuit of the electric power consumer 226 for the targeted harmonic, as in the case of FIG. 3.

Each electric power consumer 226 checks if it has a harmonic generating source therein, by itself, and may take a necessary measure.

<Fifth Embodiment>

Figure 5:
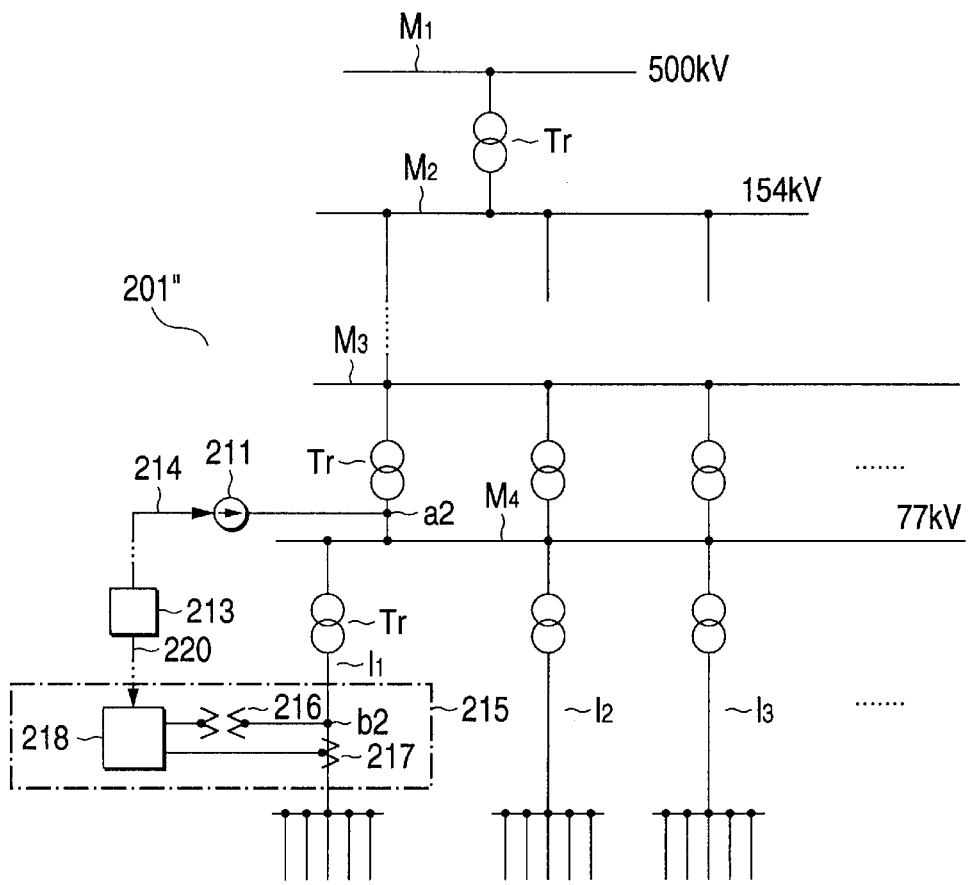
FIG. 5 is a circuit diagram showing a fifth embodiment of the present invention.

A fifth embodiment of the present invention will be described with reference to FIG. 5.

A harmonic measuring method of the invention is used to measure the harmonic characteristics in an electric power system 201" in which the upstream bus M1 is branched downstream into downstream buses M2, . . . , M3, M4, . . . in a state that a bank transformer and transformers Tr are inserted between the adjacent banks of buses.

Let us consider a case where the harmonic characteristics of the power lines l1, l2, l3, . . . which are branched downstream from the bus M4 are measured. A harmonic injection point a2 is met at the load side (closer to a power line 11) of the bank transformer Tr inserted between the buses M3 and M4. A harmonic measuring point b2 is set at the load side of the bank transformer Tr between the bus M4 and the power line 11.

The currents of the interharmonics of the frequencies f1 and f2 are injected into the harmonic injection point a2 by the current injection device 211. The admittance (value) and the current source (value) of an equivalent circuit of the power line 11 when the targeted harmonic flows therethrough by the harmonic measuring device 215 connected to the harmonic measuring point b2, as in the case of FIG. 3.

To simultaneously measure the harmonic characteristics of all the downstream power lines of the bus M4, the harmonic measuring points b2 are respectively set at the load sides of the bank transformers Tr inserted between the bus M4 and the downstream power lines. The harmonic measuring devices 215 are coupled to those harmonic measuring points b2. In this case, the current injection device 211 may be used commonly for the measurements of the harmonic characteristics of the downstream power lines.

The useful effects of the third to fifth embodiments of the invention thus far described will be described.

The current injection device 211 injects the currents of the interharmonics of the frequencies f1 and f2 into the harmonic injection point a2 in synchronism with the sync signal output from the synchronizing signal generator 213, while receiving the sync signal therefrom. The interharmonics are not contained in the harmonics of an electric power in the electric power system. The frequencies f1 and f2 of the interharmonics are each a nonintegral multiple of the frequency $f_s$ of the fundamental wave of the electric power. The harmonic measuring points b2 are set on the branch power lines to be measured, which are located downstream from the harmonic injection point a2. The harmonic measuring device 215 is connected to the harmonic measuring point b2. The voltage and current values measured at the harmonic measuring point b2 are frequency analyzed by the harmonic measuring device 215, whereby the voltage and current of the interharmonics of the frequencies f1 and f2 at that point are detected. The admittance (value) and the current source (value) of each branch power line for the interharmonics are determined to thereby specify the equivalent circuit defined by the determined circuit constants.

The admittance of the equivalent circuit for the interharmonics of the frequencies f1 and f2 is mathematically processed for interpolation to determine an admittance (value) of the equivalent circuit for the targeted harmonic Therefore, the harmonic characteristics at the harmonic measuring points b2 located downstream from the harmonic injection point a2 are accurately measured for the targeted harmonic in an individual manner.

For this reason, the harmonic characteristics of the branch power lines or the electric power consumers, located downstream from the harmonic measuring point b2, can individually be measured for the targeted harmonic in a high degree of accuracy. The same thing is true for a case where the harmonic measuring points b2 are located upstream from the harmonic injection point a2.

<Sixth Embodiment>

A sixth embodiment of the present invention will be is described with reference to FIGS. 6 through 8.

Figure 6:
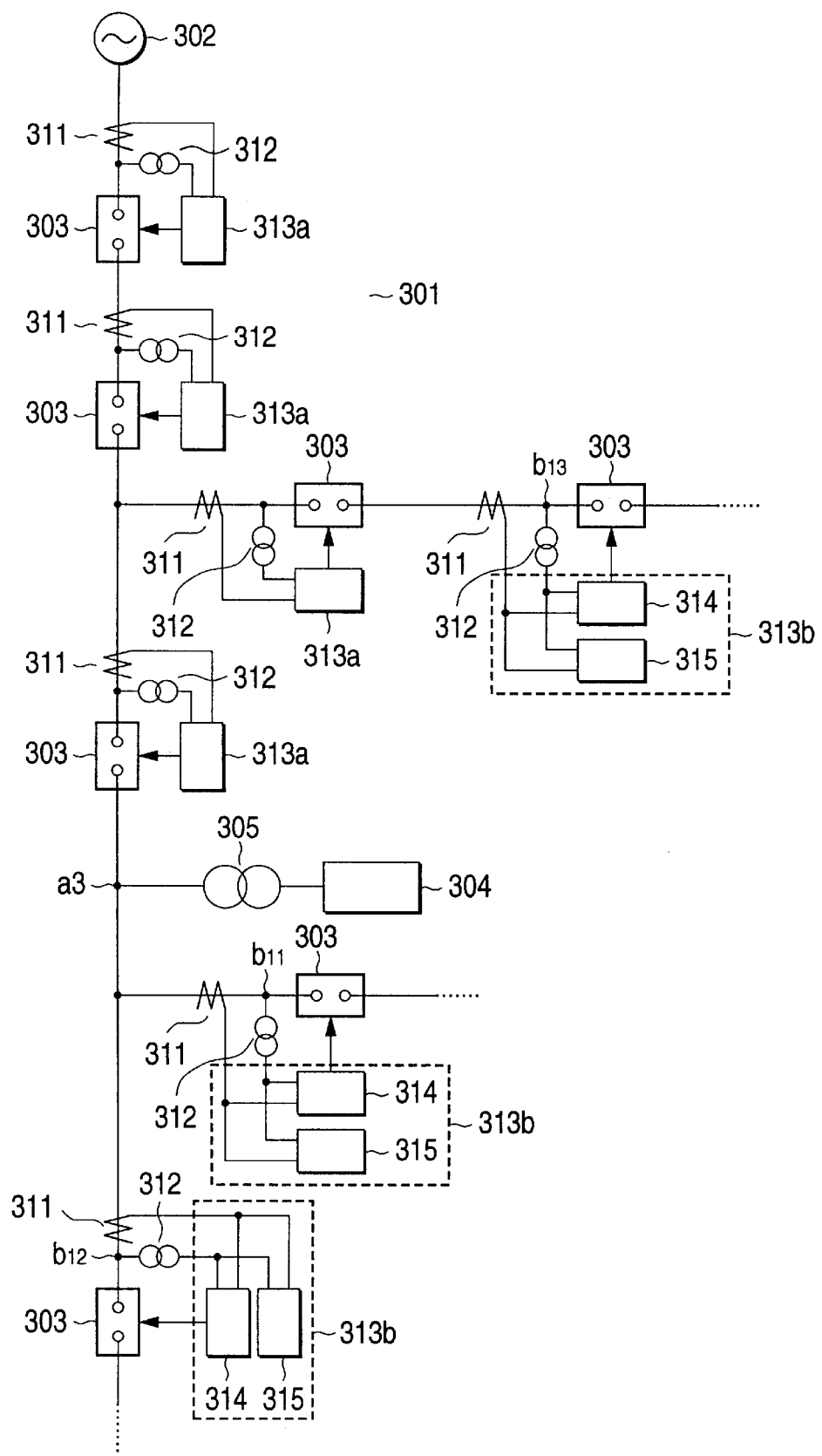
FIG. 6 is a circuit diagram showing a sixth embodiment of the present invention.
Figure 7:
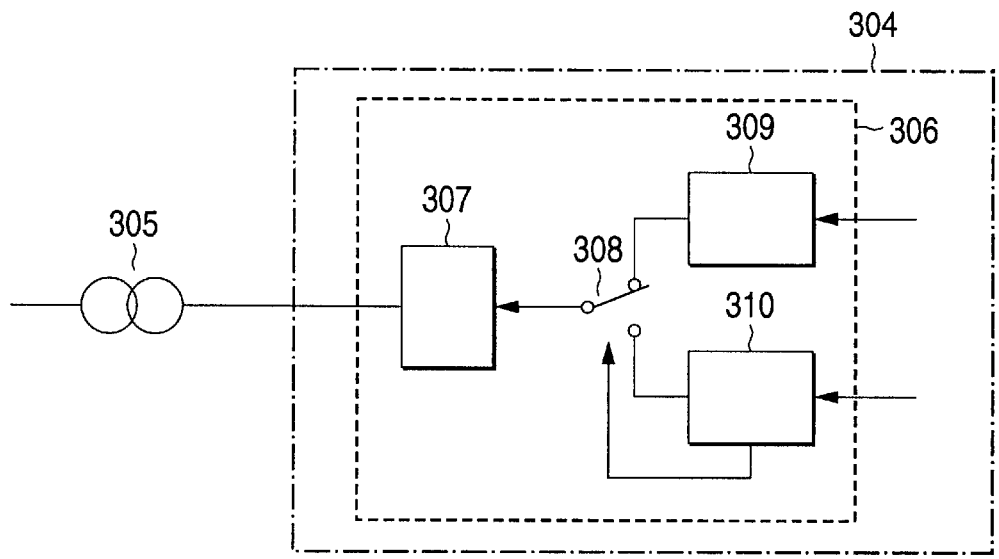
FIG. 7 is a circuit diagram showing an arrangement of a master station shown in FIG. 6.

FIG. 6 is a single line system diagram showing a power distribution system 301 which is of the distribution-line carrier communication type and the switch control function. The power distribution system 301 connected to a power source 302 is segmented into a plural number of segmental power distribution lines by a plural number of segmenting switches 303.

A master station 304 for switch control, installed at the substation of an electric power company, is connected to a proper position on the power distribution system 301 through a signal (current) injection transformer 305. This position serves as a harmonic injection point.

In most cases, this current injection point is located upstream of the power distribution system 301

The master station 304 has not only the master station function but also the current injection function for harmonic measurement. For this reason, the master station 304 includes a current injection device 306 as shown in FIG. 7.

Usually, the master station 304 operates as a master station in the distribution-line carrier communication system. The input of an inverter 307 of the frequency variable type is retained at an electrical state of the output of a communication controller 309.

A switch control operation is automatically or manually performed. In response to the operation, the communication controller 309 outputs a signal representative of switch control information to the inverter 307. A driver signal of the inverter 307 is modulated by the switch control information. A communication signal with a given frequency band, which is of the spectrum diffusion type, is produced from the inverter 307 and input to the power distribution system 301.

To measure the harmonic characteristic of the power distribution system 301, a harmonic measuring command is automatically or manually issued. In response to the command, a harmonic measurement controller 310 of the master station 304 sends to a switch 308 a switch command signal to switch the operation mode from a communication mode to a harmonic measuring mode. In response to this command, the switch 308 is turned from the communication controller 309 to the harmonic measurement controller 310.

The harmonic measurement controller 310 supplies measurement control information to the inverter 307. The information causes the inverter 307 to change its output frequency to frequencies f1 and f2 in successive manner The frequencies f1 and f2 of the inverter output signal are each a nonintegral multiple of the frequency $f_s$ of the fundamental wave of the electric power, and are located on both sides of the frequency of the targeted harmonic in frequency spectrum. The targeted harmonic is the n-th harmonic and expressed as $n \times f_s$. Those frequencies are: $f1 < n \times f_s > f2$.

The frequency of output current signal of the inverter is changed to the frequencies f1 and f2 at fixed time intervals in successive manner. During the harmonic measurement, the current signal of the frequency thus being changed, i.e., the intorharmonics of the frequencies f1 and f2, are injected to a communication/measurement injection point a3 to which a communication signal and a harmonic signal are injected.

At the end of the harmonic measurement the harmonic measurement controller 310 sends to the switch 308 a switch command signal to switch the operation mode from a harmonic measuring mode to a communication mode, In response to this command, the switch 308 is turned from the harmonic measurement controller 310 to the communication controller 309.

In the measurement of a varying harmonic characteristic of the power distribution system 301, a harmonic measurement command is issued periodically, e.g., every 30 minutes. The operation mode of the master station is changed from a communication mode to a harmonic measuring mode, and injects the currents of the interharmonics having the frequencies f1 and f2 into the injection point a3.

A measuring current transformer 311 and a measuring transformer 312 are connected to the upstream side of each of the segmenting switches 303, Further, some of the segmenting switches 303 is associated with normal slave stations 313a, and the remaining segmenting switches 303 is coupled with slave stations 313b with a harmonic measuring function.

In the case of the power distribution system 301 of FIG. 6, a communication signal receiving points of two segmenting switches 303 located downstream from the communication/measurement injection point a3 are used as harmonic measuring points. These points are communication/measuring points b11 and b12. A communication signal receiving point of one segmenting switch 303 located upstream from the communication/measurement injection point a3 is used as a harmonic measuring point. This point is a communication/measuring point b13.

The normal slave stations 313a for the distribution-line carrier communication system are coupled to the segmenting switches 303 having normal communication receiving points (except the communication/measuring points b11 to b13. The slave stations 313b with a harmonic measuring function are coupled to the segmenting switches 303 having the communication/measuring points b11 to b13.

Each normal slave station 313a includes a computer, like the slave stations of the conventional distribution-line carrier communication system; the normal slave station 313a has a reception processing function, a fault detecting function, and switch control function; the normal slave station 313a processes the output signals of the measuring current transformer 311 and the measuring transformer 312 for their filtering; the normal slave station 313a receives a communication signal from the master station 304 while having the output signals of those transformers; and the normal slave station 313a detects a fault (shortcirculting) taking place at a location downstream from the segment to which the normal slave station 313a belongs.

The normal slave station 313a controls the switching of the segmenting switches 303 associated therewith on the basis of various information, e.g., reception, detection, remote control, and fault detection.

Figure 8:
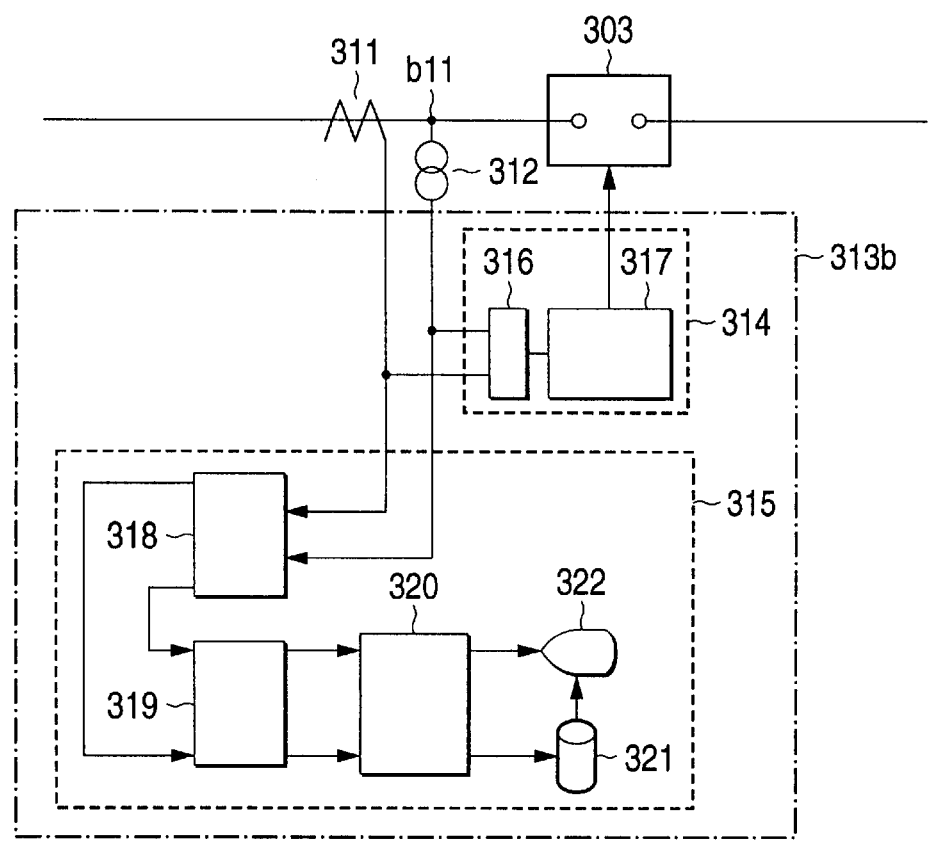
FIG. 8 is a circuit diagram showing an arrangement of a slave station used for harmonic measurement.

The detail of the slave station 313b with a harmonic measuring function is shown in FIG. 8. The slave station 313b has the function of the normal slave station 313a and the harmonic measuring function.

The slave station 313b, as shown in FIG. 8, includes a reception processor 314 as a normal functional block and a harmonic characteristic measuring device 315 as a harmonic measuring block.

The reception processor 314 includes a reception/detect processor 316 and a switch controller 317 The reception/detect processor 316 is connected to the measuring current transformer 311 and the measuring transformer 312. The reception/detect processor 316 processes a communication signal received from the master station, and detects a fault occurring at a downstream location. The switch controller 317 controls the segmenting switches 303 of its station in accordance with the reception information and detect information.

The harmonic characteristic measuring device 315 includes an A/D converter 318 connected to the measuring current transformer 311 and the measuring transformer 312. The A/D converter 318 converts the current and voltage signals, which are detected by and output from those transformers, into digital data.

The digital data is input from the A/D converter 318 to a signal processor 319. The A/D converter 319 extracts the current and voltage values for the interharmonics of the frequencies f1 and f2 and for the targeted harmonic by a digital frequency analysis, e.g., FFT or DFT.

A computing unit 320 receives those extracted data signals to obtain an equivalent circuit (for the targeted harmonic) of the power line extending downstream from each of the communication/measuring points b11 to b13 and to measure the harmonic characteristic of the power line.

The measurement results are stored in a storage portion 321 and are displayed on the screen of a display device 322.

How to measure harmonic characteristics of the power distribution system 301 by the harmonic characteristic measuring device 315 will be described in detail.

Various harmonics of frequencies are present in the power distribution system 301. The frequency of each harmonic is n (n=positive integer)×$f_s$, viz., an integral multiple of the frequency $f_s$ of the fundamental wave of an electric power transmitted by the power distribution system 301.

The equivalent circuit of the power line located downstream from each of the communication/measuring points b11 to b13 may be expressed as a parallel circuit consisting of an admittance Y(n) and a current source IG(n), as taught by Norton's theorem.

The interharmonics of the frequencies f1 and f2, which are injected for harmonic characteristic measurement, are each a nonintegral multiple of the fundamental frequency $f_s$, and hence not contained in the various harmonics present in the power distribution system 301.

For the measurement of the harmonic characteristic, the currents I1 and I2 of the interharmonics may be synchronous or asynchronous with the system power source. Usually, a digital frequency analysis, e.g., DFT or FFT, is used for detecting the current and voltage of the injected harmonics to be given later. For this reason, it is preferable to generate the currents I1 and I2 in synchronism with the frequency of the electric power of the system power source.

In the embodiment, the targeted harmonic is the fifth harmonic (n=5). The frequencies f1 and f2 of the interharmonics are set at the frequencies of the 4.5th and 5.5th harmonics. Accordingly, the currents I1 and I2 of the interharmonics are those of the 4.5th and 5.5th harmonics.

Therefore, the currents of the interharmonics are not affected by the higher harmonics in the power distribution system 301. The equivalent circuit (for the interharmonics) of the power line located downstream from each of the communication/measuring points b11 to b13 consists of only admittances Y1 and Y2.

It is assumed that the voltages and currents of the interharmonics of the frequencies f1 and f2 when those flow at the communication/measuring point b11 are V1 and V2 (=Vi, i=1, 2), and I1 and I2 (=Ii, i=1, 2). The admittance (values) Y1 and Y2 (=Yi, i=1, 2) can be obtained by putting the voltage Vi and the current Ii; both being measured, into the following equation (8), while not being affected by the harmonics in the power distribution system 301.

$$Yi=Ii/Vi \tag{8}$$

Since the admittance Yi (=Y1, Y2) is thus obtained, an admittance Y(n) of the equivalent circuit for the targeted harmonic of the frequency (n×$f_s$) is obtained by a simple interpolation given by (Y1+Y2)/2.

The current I(n) and voltage V(n) of the targeted harmonic flowing at the communication/measuring point b11 are actually measured. Putting the admittance Y(n), and the current I(n) and the voltage V(n) into the following equation (9), we have the current source (value) IG(n) of the equivalent circuit (for the targeted harmonic) located downstream from the communication/measuring point b11.

$$IG(n)=I(n)-V(n)\times Y(n) \tag{9}$$

The equivalent circuit is specified by those circuit constants, and the harmonic characteristic of the intended power line is measured.

The A/D converter 318 samples the output signals (of current and voltage) of the measuring current transformer 311 and the measuring transformer 312 and converts them into digital data.

To secure an exact frequency analysis to be performed in the subsequent stage, the sampling by the A/D converter 318 is carried out preferably in synchronism with the fundamental wave of the electric power.

The sampling frequency of the A/D converter 318 is much higher than each of the frequencies f1 and f2 of the interharmonics.

The measuring data is supplied from the A/D converter 318 to the signal processor 319. The A/D converter 319 extracts the current and voltage values Ii and Vi for the interharmonics of the frequencies f1 and f2 (at the communication/measuring point b11) by a digital frequency analysis, e.g., FFT or DFT.

The data of the current Ii and voltage Vi is input to the computing unit 320. The computing unit 320 solves the equation (8) to produce the admittance Yi.

The computing unit 320 performs the interpolation operation using the admittance Yi to determine the admittance (value) Y(n) for the targeted harmonic and to measure a harmonic characteristic of the power line extending downstream from the communication/measuring point b11.

To determined the value of the current source IG(n), immediately after the currents I1 and I2 are injected, the current I(n) and the voltage V(n) of the power distribution system 301 for the targeted harmonic are actually measured through the frequency analysis that is carried out by the signal processor 319 while using the measuring data from the A/D converter 318.

The computing unit 320 solves the equation (9) by putting the determined admittance Yi, and the actually measured current I(n) and voltage V(n) into the equation, to determine the value of the current source IG(n) for the targeted harmonic, to specify the equivalent circuit of the power line located downstream from the communication/measuring point b11 and to measure a harmonic characteristic of the same line.

The results of the measurements are visually presented, on the screen of the monitor 322, in the form of an equivalent circuit diagram, while at the same time stored into a storage portion 302.

For each of the remaining slave stations 313b coupled to the communication/measuring points b12 and b13, the harmonic characteristic measuring device 315 determines the admittance Y(n) and the current source IG(n) (for the targeted harmonic) of an intended power line, specifies the equivalent circuit thereof, and determines the harmonic characteristic thereof.

There is a case that the harmonic measuring point is set at a position in the line segment not provided with the segmenting switches 303 in the power distribution system 301 to measure a harmonic characteristic of the power distribution system. In this case, as in the above case, a measuring current transformer and a measuring transformer (like the measuring current transformer 311 and the measuring transformer 312) are coupled to the harmonic measuring point. The output signals of those transformers are input to a harmonic characteristic measuring device (like the harmonic characteristic measuring device 315). The output signals from those transformers are mathematically processed (the equations (8) and (9)) by the harmonic characteristic measuring device, and a harmonic characteristic of the intended power line in the power distribution system is performed.

The equivalent circuit of the power line (for the targeted harmonic) located upstream from each of the communication/measuring points b11, b12 and b13 is also specified by determining the related admittance (value) Y(n) and current source (value) IG(n), and the measurement of a harmonic characteristic of the power line is enabled.

In the embodiment of FIG. 6, the communication signal and the currents of the interharmonics are both injected in the master station 304 of the distribution-line carrier communication type. And the harmonic characteristic of the power line can be measured by the utilization of the master station 304, not using the harmonic characteristic measuring device exclusively used for the harmonic characteristic measurement.

The communication signal receiving point, coincident with the harmonic measuring point, is used as the communication/measuring point, and at the time of harmonic measuring, the measuring current transformer 311 and the measuring transformer 312 are used for both the distribution-line carrier communication and the harmonic measurement by the slave station 313b associated with the communication/measuring point.

For this reason, the harmonic characteristic of the power distribution system 301 of the distribution-line carrier communication type can be measured by the utilization of the master station 304, not using the harmonic characteristic measuring device exclusively used for the harmonic characteristic measurement.

It never happens that the communication signal used for the distribution-line carrier communication is concurrent with the injection of the currents of the interharmonics. Therefore, if the frequencies of those signals may be selected as desired, there is no fear of the interference of them To effect the distribution-line carrier communication used mainly for power system maintenance, it is desirable that the time to measure the harmonic characteristic is as short as possible. When the distribution-line carrier communication occurs during the harmonic characteristic measurement, an interrupt signal is issued from the master station 304, for example. In response to the interrupt signal, the switch controller 317 of the reception processor 314 in the slave station 313b instructs the signal processor 319 and the computing unit 320 of the harmonic characteristic measuring device 315 to stop their operations, whereby the harmonic measuring mode is forcibly changed to the communication mode, Each of the slave stations 313b may have the transmission function. In this case, each slave station 313b sends the harmonic measurement results to the master station 304. Accordingly, the master station 304 quickly grasps the measuring results and the like at each harmonic measuring point.

The equivalent circuits for the targeted harmonic and the interharmonics are each a parallel circuit consisting of an admittance and a current source in the above-mentioned embodiments. Each equivalent circuit may be expressed as a series circuit consisting of an impedance and a voltage source. In this case, the impedance value and the voltage value of the voltage source are obtained to specify the equivalent circuit for the harmonic characteristic measurement.

There is no limitation on the branching of the power distribution system, the position of the harmonic injection point, the position and the number of harmonic measuring point, and the constructions of the master station 304, and the slave stations 313a and 313b.

The useful effects of the sixth embodiment of the present invention will be described.

When a harmonic characteristic of the power distribution system 301 of the distribution-line carrier communication type is measured, the current injection device 306 of a master station 304 in a distribution-line carrier communication system changes its operation mode from a first injection mode for injecting a communication signal to a second mode for injecting the currents of interharmonics having frequencies f1 and f2. Therefore, the master station 304 may be used for both the carrier communication and a harmonic measurement. Further, a harmonic characteristic of a distribution line system having the switch control function of the distribution-line carrier communication system may efficiently be measured without using a harmonic characteristic measuring device exclusively used for the harmonic measurement.

The slave stations 313b coupled to the harmonic measuring points (communication/measuring points b11 to b13) are used for both the distribution-line carrier communication and the harmonic measurement. At the time of harmonic measurement, a harmonic characteristic of the power line extending upstream or downstream from each harmonic measuring point is measured by the harmonic characteristic measuring device 315 of the related slave station 313b. Therefore, the harmonic characteristic is measured by the utilization of not only the master station 304 but also the slave stations 313b This makes it more efficient to measure the harmonic characteristic of the power distribution system 301.

<Seventh Embodiment>

Figure 9:
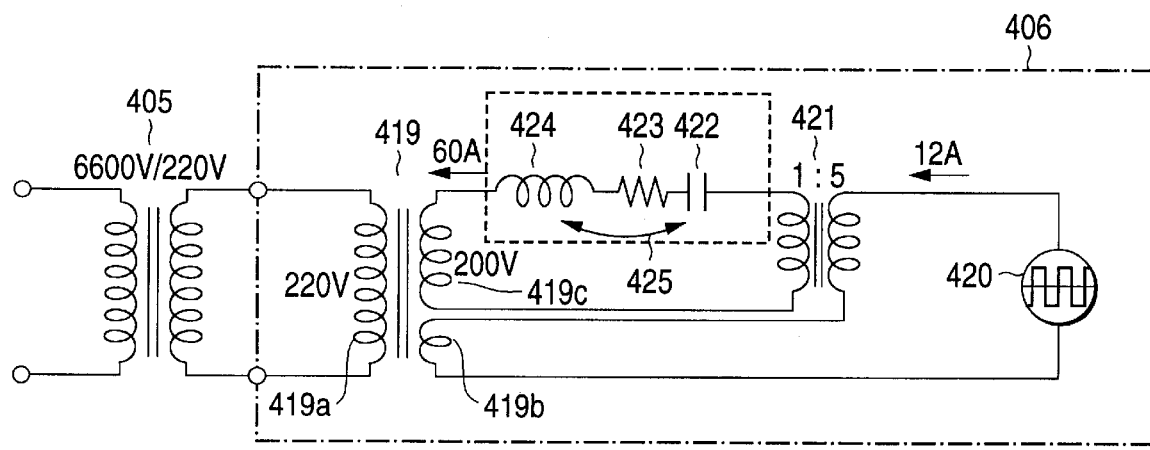
FIG. 9 is a circuit diagram showing a seventh embodiment of the present invention.

A seventh embodiment of the present invention will be described with reference to FIGS. 9 through 11.

Figure 10:
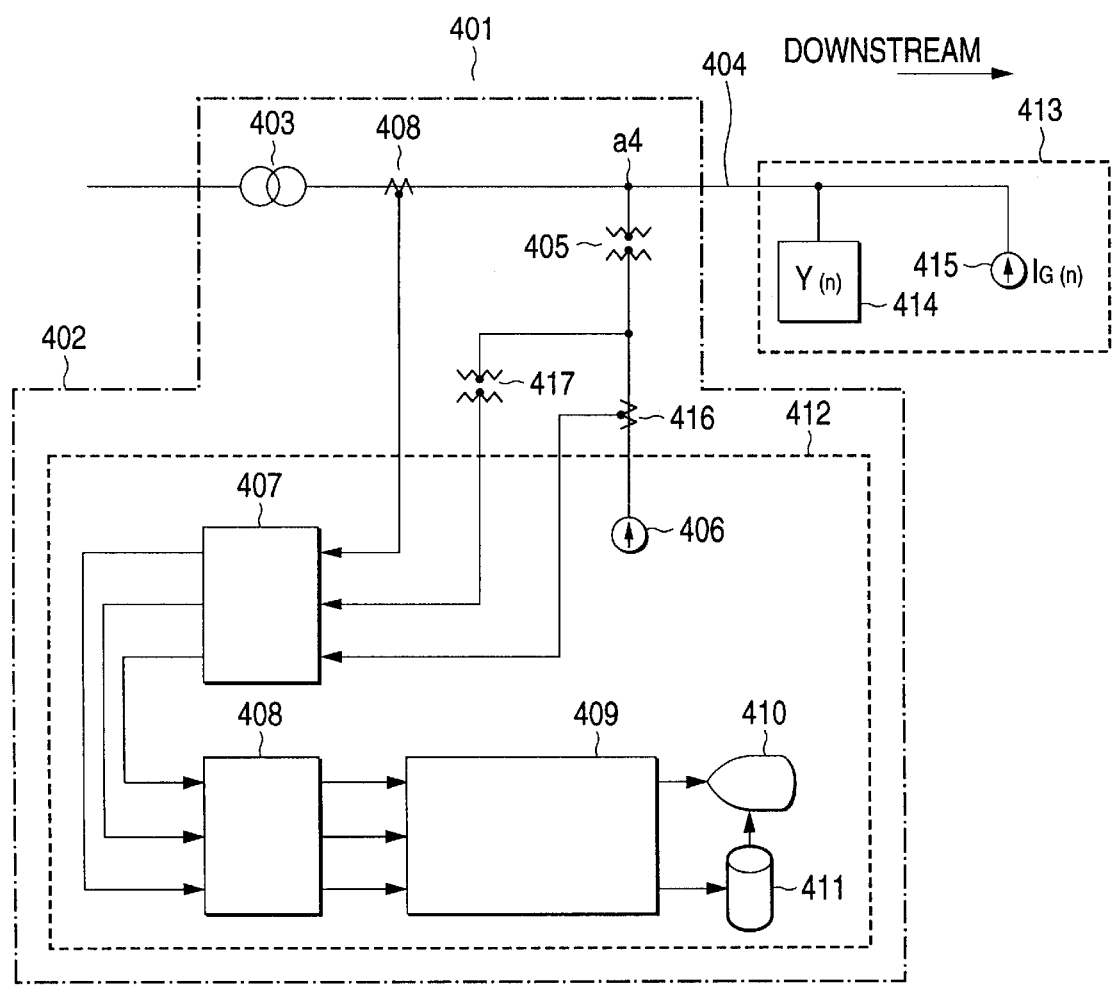
FIG. 10 is a circuit diagram showing an example of harmonic measurement using the current injection device of FIG. 9.

FIG. 10 is a single line system diagram showing a power distribution system 401 whose harmonic characteristic is measured in the form of an equivalent circuit. To measure a harmonic characteristic of the power line extended from the low voltage side (6600V) of a power distribution substation 402 of the power distribution system 401, a harmonic injection/measuring point a4 is set on a distribution bus 404 derived from the secondary side of a distribution transformer 403 of the power distribution substation 402.

An current injection device 406 for harmonic measurement is connected to the harmonic injection/measuring point a4 by way of the high voltage side (6600V) and the low voltage side (220V) of a low voltage transformer 405. A harmonic measuring device 412 is made up of the current injection device 406, A/D converter 407, signal processor 408, computing unit 409, display portion 410, and storage portion 411.

Various harmonics of frequencies are present in the power distribution system 301. The frequency of each harmonic is n (n=positive integer)×$f_s$, viz., an integral multiple of the frequency $f_s$ of the fundamental wave of an electric power transmitted by the power distribution system 401.

An equivalent circuit 413 of the power line extending downstream from the harmonic injection/measuring point a4 when those harmonics flow therethrough may be expressed as a parallel circuit consisting of an admittance 414 and a current source 415, as taught by Norton's theorem.

Usually, the current source 415 is not actual, but is caused by current distortion and the like by the load connected to the power line.

In the seventh embodiment, the fifth harmonic (n=5) and the seventh harmonic (n=7) of the harmonics present on the power distribution system 401 are used as the targeted harmonics. To measure a harmonic characteristic of the power distribution system 401 by determining the varying circuit constants of the equivalent circuit 413 for the targeted harmonics, the currents of interharmonics are individually injected into the harmonic injection/measuring point a4 by the current injection device 406. The frequencies of the interharmonics are each located on both sides of each targeted harmonic and near to the later in frequency spectrum, and a nonintegral multiple of the frequency of the fundamental wave of an electric power transmitted in the power distribution system 401.

The interharmonics are not present or not contained in the harmonics of the electric power in the electric power system. Therefore, each of the equivalent circuits of the power lines extending upstream and downstream from the harmonic injection/measuring point a4 when the interharmonics flow therethrough, may be considered as the circuits each consisting of an admittance, as taught by Norton's theorem.

The currents of the interharmonics that are injected into the harmonic injection/measuring point a4 flow upstream and downstream from the point, with their amounts depending on the admittance values for the interharmonics.

The current I(m) and voltage V(m) of each interharmonic that are injected at the harmonic injection/measuring point a4 are detected by a measuring current transformer 416 inserted in the injection line and a measuring transformer 417. The current Ix(m) of each interharmonic flowing upstream from the harmonic injection/measuring point a4 is detected by a measuring current transformer 418 located upstream from the harmonic injection/measuring point a4. The current Iy(m) of each interharmonic flowing downstream from the harmonic injection/measuring point a4 is obtained by solving an equation Iy(m)=I(m)−Ix(m).

The voltage of each interharmonic of the power line extending upstream and downstream from the harmonic injection/measuring point a4 is equal to the injection voltage V(m), and then the admittance Yy(m) of the equivalent circuit of the power line extending downstream from the harmonic injection/measuring point a4 is obtained by solving an equation Yy(m)=I(m)−Ix(m)/V(m).

For ease of explanation, it is assumed that the admittance Yy(m) for the two interharmonics is expressed as Y1(m) and Y2(m). Then, the value (Y(n)) of the admittance 414 of the equivalent circuit 413 for the targeted harmonics is obtained by solving a simple interpolation equation given by Y(n)=(Y1(m)+Y2(m))/2.

After the current injection by the current injection device 406 ends, the voltage V(n) and current I(n) of the targeted harmonic flowing downstream through the distribution bus 404 are detected by the measuring transformer 417 and the measuring current transformer 418. Then, we have the current source IG(n) of the equivalent circuit 413 by solving an equation IG(n)=Y(n)×V(n)−I(n).

A harmonic characteristic of the power line extending downstream from the harmonic injection/measuring point a4 when the targeted harmonic flows therethrough may be measured using the admittance 414 and the current source 415 of the equivalent circuit 413 for the targeted harmonic.

The current injection device 406 successively injects the currents of the interharmonics into the harmonic injection/measuring point a4 at given time intervals, and the measurement of the harmonic characteristic is completed within a short time. Then, the current injection device 406 is connected and constructed as shown in FIG. 9; a first winding 449a of a coupling transformer 419 is coupled with the low voltage side of the low voltage transformer 405, and an inverter 420 of the voltage type is connected to a second winding 419b of the coupling transformer 419.

Figure 11:
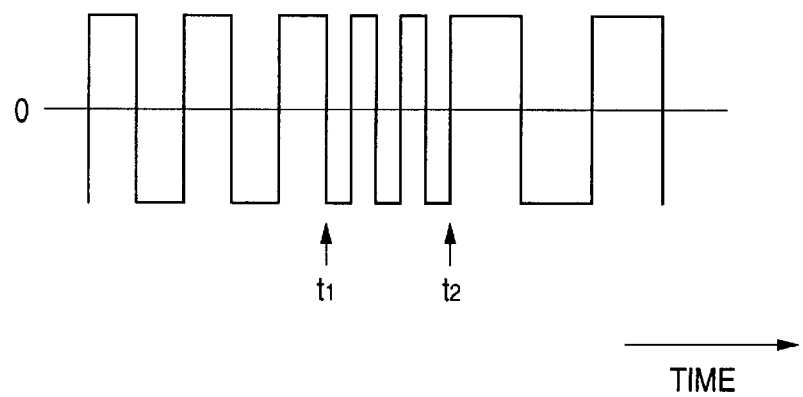
FIG. 11 is a waveform diagram showing an output signal of an inverter shown in FIG. 9.

The inverter 420 reads out the data of one or several periods of each interharmonic from a storage, egg., ROM, every set time in the order of the setting of the data (set through a timer operation), and drives semiconductor switching elements, bridge arranged, of the output portion in accordance with the readout data to thereby generate an inverter output (voltage) signal varying at the frequency of each interharmonic (FIG. 11). In FIG. 11, t1 and t2 indicate the timings of frequency variation of the inverter output signal.

In this embodiment, the output signal of the inverter 420 is transformed by a step-up transformer 421 whose winding ratio is 1:5 (the current of the output signal is stepped up, for example, from 12A to 60A). The output signal (of the set current) of the step-up transformer 421 passes through a filter portion 425 consisting of a series resonance circuit including a capacitor 422, resistor 423 and coil 424, and is supplied to a third winding 419c of the coupling transformer 419.

In the present embodiment, the 5th harmonic and the 7th harmonic, which are the most important in an actual harmonic measurement, are used as the targeted harmonics. Only the currents of the interharmonics whose frequencies are near the frequencies of the targeted harmonics via the coupling transformer 419 and the low voltage transformer 405 are injected into the harmonic injection measuring point a4. The resonance point of the filter portion 425 is set in the vicinity of the frequency of the 6th harmonic which is located at the mid point between the frequencies of the interharmonics. Therefore, the resonance characteristic has a Q curve, substantially flat in its curve, which covers a range of frequencies of the 5th harmonic to the 7th harmonic.

The currents of the interharmonics whose frequencies are located on both sides of the targeted harmonic in frequency spectrum, after removing the frequency components whose frequencies are multiples of the frequencies of the interharmonics, are ceaselessly injected every set time interval in successive order. Therefore, the harmonic characteristic measurement is completed for a short time by use of a single current injection device, The measuring current transformer 20, if it satisfies the short time rating, may be small in current capacity and size, and there is eliminated the use of radiation fins for the transformer.

The capacitor 422 of the series resonance circuit of the filter portion 425 receives in part the voltage varying at the commercial frequency (the voltage of the fundamental wave of the electric power). In this respect, the transformers 419 and 421 may be reduced in current capacity and size.

For this reason, the current injection device 406 may be constructed to be small in current capacity, size and weight, and hence may be portable.

A specific method of measuring a harmonic characteristic of the power distribution system 401 by use of the currents of the interharmonics that are injected into the harmonic injection/measuring point a4 by the current injection device 406 will be described.

For ease of explanation, it is assumed that the currents Iy1(m), Iy2(m) (=Iyi(m), I=1, 2) of the interharmonics whose frequencies are f1 and f2 are located on both sides of the targeted harmonic of $n \times f_s$ in frequency (f1<$n \times f_s$<f2) are successively injected into the harmonic injection/measuring point a4 by the current injection device 406.

During the injection of the currents Iy1(m) and Iy2(m), the currents at the harmonic injection/measuring point a4 are measured by the measuring current transformer 416, the voltage of the electric power at the harmonic injection/measuring point a4 is measured by the measuring current transformer 418, the current flowing through the power line located upstream from the harmonic injection/measuring point a4 is measured, and those measured signals are converted into digital data by the high voltage bus 7.

The measuring data output from the A/D converter 407 is frequency analyzed by the signal processor 408 (using an FFT analysis r for example). The frequency analyzing process produces the voltages V1(m) and V2(m) (=Vi(m)) at the harmonic injection/measuring point a4 and the currents Ix1(m) Ix2(m), (=Ixi(m), i=1, 2) flowing upstream from the harmonic injection/measuring point a4 for the currents I1(m), I2(m) (=I1(m), i=1, 2) injected into the harmonic injection/measuring point a4.

The data signal output from the signal processor 408 is input to the computing unit 409. The computing unit 409 carries out the following mathematical processes: 1) Iyi(m)=I1(m)−Ix(m) (currents Iy1(m) and Vy2(m) flowing downstream from the harmonic injection/measuring point a4 are obtained by this equation, using the current Ixi(m) is already measured), and 2) Yyi(m)=Iyi(m)/Vi(m) (Yyi(m)=Yy1, Yy2 (m) is obtained for the current Iy1(m), Iy2(m) by this equation).

The signal component having the frequency equal to that of current Iyi(m) is not present originally in the power distribution system 401. Therefore, even if the electric power injected by the current injection device 406 is small, the admittance Yy(i) is exactly obtained while not affected by the harmonics of the power distribution system 401.

If the current of the harmonic to be measured, or the targeted harmonic, is injected in place of the current Ii(m) of the interharmonic, it is impossible to obtain an exact admittance for the harmonic injected because such a harmonic is contained in the harmonics on the power distribution system 401.

Alternatively, the current Iyi(m) may be obtained by measuring the current flowing downstream from the harmonic injection/measuring point a4.

The computing unit 409 carries out an interpolation process of, for example, Yy(n)=Yy1(m) +Yy2(m) and determines the admittance Yy1(n) for the targeted harmonic flowing downstream from the harmonic injection/measuring point a4.

The admittance Yy1(m), Yy2(m) can be determined without any influence by the harmonics present in the power distribution system 401. Therefore, the admittance Yy(n) (admittance 414) for the targeted harmonic is exactly obtained.

Immediately after the current injection by the current injection device 406 ends, the voltage V(n) on the distribution bus 404 for the targeted harmonic and the current Iy(n) flowing downward are obtained through the frequency analysis of the measuring voltage derived from the measuring transformer 417 and the measuring current derived from the measuring current transformer 418.

Then, the current value of the current source IGy(n) (current source 415) is obtained by putting the values of the admittance Yy(n), voltage V(n) and current I(n) into an equation IGy(n)=Ty(n)×V(n)−Iy(n).

By the admittance Yy(n) (admittance 414) and the current source (value) IGy(n) (current source 415), the equivalent circuit 413 is specified, and a harmonic characteristic of the power line extending downstream from the harmonic injection/measuring point a4 is measured correctly A harmonic characteristic of the power line extending upstream from the harmonic injection/measuring point a4 may also be measured in a similar manner.

The admittance Yx1(m), Yx2(m) (=Yxi(m)) (for the interharmonics) of the power line extending downstream from the harmonic injection/measuring point a4 is obtained according to an equation Yxi(m) Ixi(m)/Vi(m) by putting the currents Ix1(m), Ix2(m) (=Ixi(m)) of the interharmonics, which result from the measuring current Ixi(m) and the measuring voltage Vxi(m), into that equation.

The admittance Yx(n) of the equivalent circuit of the power line extending upstream from the harmonic injection/measuring point a4 is obtained through an interpolation of Yx(n)=(Yx1(m)+Yx2(m))/2, as in the case of the admittance Yy(n).

The current source (value) IGx(n) of the equivalent circuit (for the targeted harmonic) of the power line located upstream from the harmonic injection/measuring point a4 is obtained according to an equation IGx(n)=Yx(n)×V(n)+Ix(n) by putting the admittance Yx(n), voltage V(n) and current I(n) into the equation, as in the case of the current source 415.

The equivalent circuit (for the targeted harmonic) of the power line located upstream from the harmonic injection/measuring point a4 is specified by the admittance Yx(n) and the current source IGx(n), as in the case of the equivalent circuit 413, and a harmonic characteristic of the power line located upstream from the harmonic injection/measuring point a4 is measured accurately.

In the above-mentioned embodiment, one point, or the harmonic injection/measuring point a4, is used for both the harmonic injection and the harmonic measurement. If necessary, different points may be used for the harmonic injection and the harmonic measurement. In this case, the current injection device 406 is connected to the harmonic injection point. The measuring transformer 417 and the measuring current transformer 419 are coupled to the harmonic measuring point. With such an arrangement, the equivalent circuit is specified and the harmonic characteristic is measured. In such an arrangement for harmonic measurement, the current injection device may be small in size and low in weight, and therefore the current injection device used has a good portability. Further, it is easy to transport the current injection device to the harmonic injection point.

In the measurement using different points for the harmonic measuring point and the harmonic injection point, to measure the harmonic characteristic, a plural number of harmonic injection points are set at branched buses, a plural number of current injection devices are used, and the currents of the interharmonics are injected into those points by the current injection devices.

The number, positions and the like of the harmonic injection points and the harmonic measuring points may be properly selected, as a matter of course.

When plural pairs of interharmonics are used or the harmonic measurement is simultaneously carried out for all of those pairs of interharmonics, the inverter 420 is designed so as to generate signals of at least three frequencies and to switch those signals one from another in successive manner.

Any type of inverter may be used for the inverter 420 if its output frequency may be successively varied to the frequencies of the interharmonics set by a timer, for example.

The step-up transformer 421, coupled to the output of the inverter 420, may be omitted if the output current of the inverter 420 is satisfactorily large.

The resonance characteristic of the filter portion 425 may be set depending on the frequency range of the interharmonics to be extracted. In this case, it is desirable that the Q curve is flat over the necessary frequency range so that the currents of the interharmonics are extracted through the same resonance characteristic.

The same thing is correspondingly applied to a case where each equivalent circuit may be expressed as a series circuit consisting of an impedance and a voltage source, in place of the parallel circuit consisting of the admittance and the current source.

The effects of the seventh embodiment will be described hereunder.

The frequency of the output signal of the inverter 420 is successively varied to the frequencies of the interharmonics.

The filter portion 425 resonates with the frequencies of the interharmonics. Through the resonance, the filter portion 425 filters off the frequencies are selected to remove unnecessary frequencies, e.g., the frequency of the fundamental wave of the electric power, and the frequencies being multiples of the frequencies of the interharmonics. In other words, the filter portion 425 allows only the interharmonics to pass therethrough, by its frequency selective function.

The currents of the interharmonics may be injected from the filter portion 425 through the coupling transformer 419 to the power distribution system.

In this case, a single current injection device may be used for the current injection.

Further, the frequency of the output signal of the current injection device 406 is successively varied to the frequencies of the interharmonics, and the current injection is completed for a short time.

Therefore, the harmonic characteristic can accurately be measured by use of the current injection device 406 of small current capacity and small size.

What is claimed is:

1. A measuring method comprising the steps of:
    setting a harmonic injection point on a power line extending downstream from a harmonic measuring point in an electric power system;
    injecting at least one current of interharmonics to said harmonic injection point by a current injection device coupled to said harmonic injection point, frequencies f1 and f2 of said interharmonics being located on both sides of the frequency of an n-th targeted harmonic in a frequency spectrum and each of said frequencies being a nonintegral multiple of the frequency $f_s$ of a fundamental wave of the electric power transmitted by said electric power system, the frequency of said n-th targeted harmonic being $n \times f_s$, and $f1 < n \times f_s < f2$;
    detecting at least one current value and at least one voltage value of said interharmonics at said harmonic measuring point to thereby obtain at least one interharmonic admittance value of an equivalent circuit of said power line extending upstream from said harmonic measuring point when said interharmonics flow therethrough;
    determining a harmonic admittance value for said n-th targeted harmonic of said equivalent circuit of said power line when said n-th targeted harmonic flows therethrough by interpolating said at least one interharmonic admittance value for said interharmonics; and
    measuring a harmonic characteristic for said n-th targeted harmonic of said power line extending upstream from said harmonic measuring point, which is set at a point located upstream from said harmonic injection point.

2. A measuring method comprising the steps of:
    setting a plural number of harmonic injection points on a plural number of low voltage buses branched downstream from a harmonic measuring point in an electric power system;
    connecting current injection devices to said plural number of harmonic injection points;
    injecting, simultaneously and synchronously, at least one current of interharmonics to said harmonic injection point by said current injection devices, the frequencies f1 and f2 of said interharmonics being located on both sides of the frequency of an n-th targeted harmonic in a frequency spectrum and each of said frequencies being a nonintegral multiple of the frequency $f_s$ of a fundamental wave of an electric power transmitted by said electric power system, the frequency of said n-th targeted harmonic being $n \times f_s$, and $f1 < n \times f_s < f2$;
    detecting at least one current value and at least one voltage value of said interharmonics at said harmonic measuring point by a characteristic measuring device coupled to said harmonic measuring point, to thereby obtain at least one interharmonic admittance value of an equivalent circuit of said power line extending upstream from said harmonic measuring point when said interharmonics flow therethrough;
    determining a harmonic admittance value for said n-th targeted harmonic of said equivalent circuit of said power line when said n-th targeted harmonic fows therethrough by interpolating said at least one interharmonic admittance value for said interharmonics; and
    measuring a harmonic characteristic for said n-th targeted harmonic of said power line extending upstream from said harmonic measuring point.

3. A measuring method comprising the steps of:
    connecting a current injection device to a harmonic measuring point on an electric power system;
    injecting at least one current of interharmonics to said harmonic injection point by said current injection device in response to an output signal of a synchronizing device, which is synchronized with the fundamental wave of the electric power transmitted by said electric power system, the frequencies f1 and f2 of said interharmonics being located on both sides of the frequency of an n-th targeted harmonic in frequency spectrum and each of said frequencies being a nonintegral multiple of the frequency $f_s$ of the fundamental wave, the frequency of said n-th targeted harmonic being $n \times f_s$, and $f1 < n \times f_s < f2$;

setting a plural number of harmonic measuring points on a plural number of power lines branched downstream or upstream from said harmonic injection point in said electric power system;

setting harmonic measuring devices at said plural number of harmonic measuring points;

measuring a current and voltage at said harmonic measuring points by said harmonic measuring devices;

detecting at least one current and at least one voltage of said interharmonics at said harmonic measuring points through frequency analyzing said at least one current and at least one voltage detected at said harmonic measuring points by said harmonic measuring devices in synchronism with the output signal of said synchronizing device, to thereby determine at least one interharmonic admittance value of an equivalent circuit of each said power line extending downstream or upstream from each said harmonic measuring point when said interharmonics flow therethrough;

determining a harmonic admittance value for said n-th targeted harmonic of said equivalent circuit of each said power line when said n-th targeted harmonic flows therethrough by interpolating said at least one interharmonic admittance value for said interharmonics, to thereby measure a harmonic characteristic for said n-th targeted harmonic.

4. A measuring method comprising the steps of:

injecting at least one current of interharmonics to a harmonic injection point in an electric power system, the frequencies of f1 and f2 of said interharmonics being located on both sides of the frequency of an n-th targeted harmonic in a frequency spectrum and each of said frequencies being a nonintegral multiple of the frequency $f_s$ of the fundamental wave of the electric power transmitted by said electric power system, the frequency of said n-th targeted harmonic being $n \times f_s$, and $f1 < n \times f_s < f2$, determining at least one interharmonic admittance or impedance value of an equivalent circuit of said power line extending downstream or upstream from said harmonic measuring point when said interharmonics flow therethrough by frequency analyzing at least one current and at least one voltage of the electric power measured at said harmonic measuring point, and determining an n-th targeted harmonic admittance or impedance value of said equivalent circuit of said power line when said n-th targeted harmonic flows therethrough by interpolating said at least one interharmonic admittance or impedance value for said interharmonics, to thereby measure a n-th targeted harmonic characteristic for said n-th targeted harmonic; wherein A) said electric power system includes a power distribution system in which switch control information is sent from a master station to a slave station by use of a distribution-line carrier communication system;

B) said master station includes a current injecting device for selectively injecting a communication signal for the distribution-line carrier communication or said at least one current of said interharmonics of the frequencies f1 and f2; and C) when a harmonic measurement is conducted, said master station injects said at least one current of said interharmonics to said harmonic injection point.

5. A measuring method according to claim 4, wherein said slave station coupled to said harmonic measuring point includes:

A) a reception processor for receiving said communication signal by a measuring current transformer and a measuring transformer, both coupled with said power distribution system, and reproducing the same; and B) a characteristic measuring device for determining said at least one interharmonic admittance or impedance value of said equivalent circuit of said power line extending downstream or upstream from said harmonic measuring point when said interharmonics flow therethrough by frequency analyzing the measuring signals output from said measuring current transformer and said measuring transformer, and for determining said n-th targeted harmonic admittance or impedance value of said equivalent circuit of said power line when said n-th targeted harmonic flows therethrough by interpolating said at least one interharmonic admittance or impedance value for said interharmonics; and C) when said harmonic measurement is conducted, said slave station at said harmonic measuring point detects said at least one current and at least one voltage of said interharmonics injected into said power distribution system, to thereby measure the n-th harmonic characteristic.

6. A current injection device for a measurement wherein at least one current of interharmonics is injected into an electric power system, the frequencies of said interharmonics being located on both sides of the frequency of an n-th targeted harmonic in a frequency spectrum and each of said frequencies being a nonintegral multiple of the frequency of the fundamental wave of the electric power transmitted by said electric power system, the currents and voltages of said interharmonics on a power line are detected through a frequency analysis of a measuring current and a measuring voltage of said electric power, to thereby determine at least one interharmonic admittance or impedance value of an equivalent circuit of said power line when said interharmonics flows therethrough, a harmonic admittance or impedance value of said equivalent circuit for said n-th targeted harmonic is determined by interpolating said at least one interharmonic admittance or impedance value for said n-th targeted harmonic, whereby a harmonic characteristic of said power line for said n-th targeted harmonic is measured, said current injection device being used for injecting said at least one current of interharmonics into said electric power system;

said current injection device comprising:

an inverter of which an output frequency is successfully varied to the frequencies of said interharmonics;

a filter portion for extracting only said interharmonics from said output signal of said inverter and outputting said extracted interharmonics, said filter portion including a resonance circuit whose resonance point is set at the mid point between the frequencies of said interharmonics; and a coupling transformer for injecting said at least one current of interharmonics received from said filter portion into said electric power system.

* * * * *